United States Patent
Otsuga et al.

(10) Patent No.: US 7,323,741 B2
(45) Date of Patent: Jan. 29, 2008

(54) SEMICONDUCTOR NONVOLATILE MEMORY DEVICE

(75) Inventors: Kazuo Otsuga, Kokubunji (JP); Hideaki Kurata, Kodaira (JP); Yoshitaka Sasago, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 185 days.

(21) Appl. No.: 10/998,630

(22) Filed: Nov. 30, 2004

(65) Prior Publication Data

US 2005/0127429 A1 Jun. 16, 2005

(30) Foreign Application Priority Data

Dec. 1, 2003 (JP) ............................ 2003-401783
Nov. 4, 2004 (JP) ............................ 2004-320769

(51) Int. Cl.
*H01L 29/788* (2006.01)
*H01L 29/76* (2006.01)
*H01L 29/94* (2006.01)
*H01L 31/00* (2006.01)

(52) U.S. Cl. ............... 257/316; 257/390; 257/E29.129; 257/E21.68

(58) Field of Classification Search ............... 257/315, 257/390, E29.129, E21.68
See application file for complete search history.

(56) References Cited

U.S. PATENT DOCUMENTS 6,437,398 B2 * 8/2002 Widdershoven ............. 257/323
6,501,680 B1 * 12/2002 Kwon .................... 365/185.05
6,642,569 B2 * 11/2003 Mori et al. .................. 257/314
6,710,465 B2 * 3/2004 Song et al. .................. 257/316
6,744,106 B2 * 6/2004 Kanai ......................... 257/390
6,937,514 B2 * 8/2005 Hasegawa .............. 365/185.12
2003/0155607 A1 8/2003 Kamigaki et al.
2004/0084714 A1 5/2004 Ishii et al.
2004/0095808 A1 5/2004 Kurata et al.

OTHER PUBLICATIONS

Boaz Eitan et al., "Can NROM, a 2 Bit, Trapping Storage NVM Cell, Give a Real Challenge to Floating Gate Cells?", Extended Abstract of the 1999 International conference on Solid State Devices and Materials, Tokyo, 1999, pp. 522-524.
F. Arai et al., "High-Density (4.4F$^2$) NAND Flash Technology Using Super Shallow Channel Profile (SSCP) Engineering", 2000 IEEE, pp. 775-778.
T. Kobayashi et al., "A Giga-Scale Assist Gate (AG)-AND-Type Flash Memory Cell with 20-MB/s Programming Throughput for Content-Downloading Applications", 2001 IEEE, pp. 29-32.

* cited by examiner

*Primary Examiner*—Ngân V. Ngô
(74) *Attorney, Agent, or Firm*—Reed Smith LLP; Stanley P. Fisher, Esq.; Juan Carlos A. Marquez, Esq.

(57) ABSTRACT

A low cost semiconductor nonvolatile memory device capable of high speed programming, using an inversion layer as the wiring, and a manufacturing method for that device. The semiconductor memory device includes an auxiliary electrode at a position between and in parallel with the source and drain regions and with no position overlap versus the source region and the drain region formed mutually in parallel; wherein the auxiliary electrode for hot electron source injection is utilized as the auxiliary electrode for programming (writing); and an inversion layer formed below the auxiliary electrode is utilized as the source region or as the drain region during the read operation.

4 Claims, 29 Drawing Sheets

SEMICONDUCTOR NONVOLATILE MEMORY DEVICE

CLAIM OF PRIORITY

The present application claims priority from Japanese Application JP 2003-401783 filed on Dec. 1, 2003, and Japanese Application JP 2004-320769 filed on Nov. 4, 2004, the contents of which are hereby incorporated by reference into this application.

FIELD OF THE INVENTION

The present invention relates to a semiconductor nonvolatile memory device.

BACKGROUND OF THE INVENTION

Flash memories are widely known in the related art as semiconductor nonvolatile memory devices ideal for storing data in portable form. The cost per flash memory bit sharply decreases each year and this decrease is even steeper than projected from only a steadily reduced memory size. This decreased cost is due to improvements in the device structure or to use of multilevel storage. Technology of the prior art relating to large capacity flash memories for file applications is disclosed for example in F. Arai, et al., IEEE International Electron Devices Meeting pp. 775-778, 2000 (non-patent document 2) and in T. Kobayashi et al., IEEE International Electron Devices Meeting pp. 29-32, 2001 (non-patent document 1). The former method utilized a structure called a NAND gate designed to yield a small cell size. The latter method utilized a structure called an AND gate designed for multilevel storage operation to control the number of electrons stored inside the floating gate to store large numbers of bits. Both of these methods were effective in reducing the cost.

Another example of multilevel storage is disclosed in B. Eitan et al., International Conference on Solid State Devices and Materials pp. 522-524, 1999 (non-patent document 3). In this method, a device injects electrical charges by hot electrons, utilizing SiN in the storage region. This method utilizes the electrical charges that accumulate in the vicinity of the location where the charges are injected due to electrical charges that accumulate in the SiN trap, and also the hot electrons emitted mainly in the vicinity of the drain terminal. Both the source terminal and the drain terminal are utilized as the electrical charge storage region by interchanging the voltages applied to the source and the drain. This program (write) method requires a large electrical current flow and the current supplied by the power supply is limited and so is not suited for file applications where numerous bits are being programmed (written) at the same time. A programming operation for injection on the source side with a lower drain current is disclosed in JP-A No. 156275/2001 (patent document 1). This technology achieves a small cell size and utilizes auxiliary electrodes for injection on the source side in an operation utilizing an inversion layer below the auxiliary electrode as the wiring.

[Patent document 1] JP-A No. 156275/2001

[Non-patent document 1] F. Arai. et al., IEEE International Electron Devices Meeting pp. 775-778, 2000

[Non-patent document 2] T. Kobayashi et al., IEEE International Electron Devices Meeting pp. 29-32, 2001

[Non-patent document 3] B. Eitan et al., International Conference on Solid State Devices and Materials pp. 522-524, 1999

A lower cost per bit in flash memories was achieved by improving the device structure or by utilizing multilevel storage to reduce the memory size through patterning method size reduction. The increased capacity of the flash memory also ensures an expanding range of applications for handling large size files such as music and moving picture files. The demand for large capacity flash memories also having a fast program (writing) speed is likely to grow even larger from hereon.

However, the structure of NAND type devices are nearing a surface area of $4F^2$ (F is the patterning dimension) per cell which is the logical limit on flat (planar) memory cell structures. It will prove difficult to make the cell surface area any smaller than this dimension. This fact suggests further progress is needed in multilevel storage. Further problems are that the program (write) speed is not fast because the Fowler-Nordheim (hereafter abbreviated to FN) tunnel is utilized for programming, or that large voltages must be utilized.

However, hot electron programming technology using AND device can be utilized for high speed programming. This technology utilizes the source injection method for hot electron programming (writing) and so is suited for simultaneous programming of many cells. Moreover, the array structure utilizes parallel connections without the serial connections used in the NAND type device. The AND type device is therefore much less susceptible to effects from memory information of other cells, and is suited for large bit storage per cell. However, there are problems with this AND device. In terms of cell size, the diffusion layers in the array structure extend in parallel so that this device has the problem that the vertical pitch in the word lines is difficult to shrink (reduce) due to widening of the diffusion layer or the device isolation regions. Moreover, when using the source injection method for hot electron programming, variations occurs in the voltage set for the auxiliary electrode and cause the problem of non-uniform cell programming characteristics. Further, in the AND type device, the memory cells are connected in parallel with the local data line so that the distance to the contact differs according to the memory cell position. The voltage on the local data line therefore drops, causing the voltage potential applied to the cell to fluctuate and causing the problem of variations (non-uniformities) in cell programming characteristics.

SUMMARY OF THE INVENTION

The present invention therefore has the object of providing a method for achieving a semiconductor memory device with reduced memory cell size and without large variations in cell programming characteristics.

The essential structure of the present invention includes an auxiliary electrode at a position between and in parallel with the source and drain regions and with no position overlap versus the source region and the drain region formed mutually in parallel; wherein an auxiliary electrode is utilized as the auxiliary electrode for hot electron source injection during the programming (writing) operation; and an inversion layer formed below the auxiliary electrode is utilized as the source region or as the drain region during the read operation.

The main aspects of the present invention are described next.

A semiconductor nonvolatile memory device including a first and a second electrode mutually wired in parallel in a first direction, and a third electrode for controlling the voltage potential on the semiconductor surface between that first electrode and second electrode, and the third electrode is wired in a second direction substantially perpendicular to the second direction, and a means for holding an electrical charge enclosed on the periphery by insulator film between the first electrode and the second electrode, and moreover, an operating method wherein, by forming a first inversion layer in the vicinity of the semiconductor surface by setting the first electrode to a voltage potential A, and setting a first inversion layer voltage potential to a voltage potential B lower than a voltage potential A, and forming a second inversion layer in the vicinity of the semiconductor surface by setting the second electrode to a voltage potential C, and then setting the voltage potential of the second inversion layer to a voltage potential D higher than the voltage potential B and lower than the voltage potential C, and terminating the connection between the second inversion layer and the power supply to set a floating state, and by setting the voltage potential on the third electrode to a voltage potential E higher the voltage potential C, the electrical charge accumulated on the second inversion layer passes through the semiconductor surfaces under the charge holding means, and during discharge to the first inversion layer, the hot electrons emitted in the vicinity of the first electrode are injected into the charge holding means.

A semiconductor nonvolatile memory device including a first, second and fourth electrode mutually wired in parallel in a first direction, and a fifth electrode for controlling the voltage potential on the semiconductor surface between the first electrode and the second electrode, as well as between the second electrode and the fourth electrode, and the fifth electrode is wired in the second direction substantially perpendicular to the first direction, and a first charge holding means for holding an electrical charge enclosed by insulator film on the periphery between the first electrode and the second electrode, and a second charge holding means for holding an electrical charge enclosed by insulator film on the periphery between the second electrode and the fourth electrode, and moreover, an operating method wherein, by forming a first inversion layer in the vicinity of the semiconductor surface by setting the first electrode to a voltage potential A, and setting a first inversion layer voltage potential to a voltage potential B lower than a voltage potential A, and forming a second inversion layer in the vicinity of the semiconductor surface by setting the fourth electrode to a voltage potential C, and then setting the voltage potential of the second inversion layer to a voltage potential D higher than the voltage potential B and lower than the voltage potential C, and terminating the connection between the second inversion layer and the power supply to set a floating state, and setting the voltage potential on the second electrode to voltage potential E lower than the voltage potential A, and by setting the voltage potential on the fifth electrode to a voltage potential F higher than the voltage potential C, the electrical charge accumulated on the second inversion layer passes through the semiconductor surfaces under the second charge holding means, the semiconductor surfaces under the second electrode, and the semiconductor surfaces under the first charge holding means, and during discharge to the first inversion layer, the hot electrons emitted on the semiconductor surface between the second and the fourth electrodes are injected into the second charge holding means.

A semiconductor nonvolatile memory device including a first and a second electrode mutually wired in parallel in a first direction, and a third electrode for controlling the voltage potential on the semiconductor surface between the first electrode and the second electrode, and the third electrode is wired in the second direction substantially perpendicular to the first direction, and a means for holding an electrical charge enclosed by insulator film on the periphery between the first electrode and the second electrode, and moreover, an operating method wherein, by forming a first inversion layer in the vicinity of the semiconductor surface by setting the first electrode to a voltage potential A, and setting the voltage potential on the first inversion layer to a voltage potential B lower than a voltage potential A, and forming a second inversion layer in the vicinity of the semiconductor surface by setting the second electrode to a voltage potential C, and then setting the voltage potential of the second inversion layer to a voltage potential D higher than the voltage potential B and lower than the voltage potential C, and terminating the connection between the second inversion layer and the power supply to set a floating state, and by setting the voltage potential on the third electrode to a voltage potential E higher the voltage potential C, when the electrical charge accumulated on the second inversion layer passes through the semiconductor surface under the charge holding means and discharges to the first inversion layer, and while hot electrons emitted in the vicinity of the first electrode are injected into the means for holding the charge, an electrical charge is supplied via the transistor formed between the second inversion layer and the power supply supplying power to the second inversion layer, so that the voltage potential on the second inversion layer does not fall below a fixed value to a level where hot electron injection is not performed.

A semiconductor nonvolatile memory device including a first, second and fourth electrode mutually wired in parallel in a first direction, and a fifth electrode for controlling the voltage potential on the semiconductor surface between the first electrode and the second electrode, as well as between the second electrode and the fourth electrode, and the fifth electrode is wired in the second direction substantially perpendicular to the first direction, and a first charge holding means for holding an electrical charge enclosed by insulator film on the periphery between the first electrode and the second electrode, and a second charge holding means for holding an electrical charge enclosed by insulator film on the periphery between the second electrode and the fourth electrode, and moreover, an operating method wherein, by forming a first inversion layer in the vicinity of the semiconductor surface by setting the first electrode to a voltage potential A, and setting the voltage potential on the first inversion layer to a voltage potential B lower than a voltage potential A, and forming a second inversion layer in the vicinity of the semiconductor surface by setting the fourth electrode to a voltage potential C, and then setting the voltage potential of the second inversion layer to a voltage potential D higher than the voltage potential B and lower than the voltage potential C, and terminating the connection between the second inversion layer and the power supply to set a floating state, and by setting the voltage potential on the second electrode to a voltage potential E lower than the voltage potential A, and by setting the voltage potential on the fifth electrode to a voltage potential F higher the voltage potential C, the electrical charge accumulated on the second inversion layer passes through the semiconductor surface under the second charge holding means, the semiconductor surface under the second electrode layer, and the semiconductor surface under the first charge holding means, and during discharge to the first inversion layer and while hot electrons emitted on the semiconductor surface between the second and fourth electrode, are injected into the second means charge holding means, an electrical charge is supplied via the transistor formed between the second inversion layer and the power supply supplying power to the second inversion layer, so that the voltage potential on the second inversion layer does not fall below a fixed value to a level where hot electron injection is not performed.

A semiconductor nonvolatile memory device including a first, second and fourth electrode mutually wired in parallel in a first direction, and a fifth electrode for controlling the voltage potential on the semiconductor surface between the first electrode and the second electrode, as well as between the second electrode and the fourth electrode, and the fifth electrode is wired in the second direction substantially perpendicular to the first direction, and a first charge holding means for holding an electrical charge enclosed by insulator film on the periphery between the first electrode and the second electrode, and a second charge holding means for holding an electrical charge enclosed by insulator film-on the periphery between the second electrode and the fourth electrode, and moreover, an operating method wherein, by forming a first inversion layer in the vicinity of the semiconductor surface by setting the first electrode to a voltage potential A, and setting the first inversion layer voltage potential to a voltage potential B lower than a voltage potential A, and terminating the connection between the first inversion layer and the power supply to set a floating state, and forming a second inversion layer in the vicinity of the semiconductor surface by setting the fourth electrode to a voltage potential C, and setting the voltage potential on the second inversion layer to a voltage potential D higher than the voltage potential B and lower than the voltage potential C, and terminating the connection between the second inversion layer and the power supply to set a floating state, and setting the voltage potential on the second electrode to voltage potential E lower than the voltage potential A, and by setting the voltage potential on the fifth electrode to a voltage potential F higher than the voltage potential C, the electrical charge accumulated on the second inversion layer passes through the semiconductor surfaces under the second charge holding means, the semiconductor surfaces under the second electrode, and the semiconductor surfaces under the first charge holding means, and during precharge of the first inversion layer, the hot electrons emitted in the vicinity of the semiconductor surface between the second and the fourth electrodes are injected into the second charge holding means.

A semiconductor nonvolatile memory device including a first and a second electrode mutually wired in parallel in a first direction, and a third electrode for controlling the voltage potential on the semiconductor surface between that first electrode and second electrode, and a third electrode wired in the second direction substantially perpendicular to the first direction, and a charge holding means for holding an electrical charge enclosed on the periphery by insulator film between the first electrode and the second electrode, and moreover, an operating method wherein, by forming a first inversion layer in the vicinity of the semiconductor surface by setting the first electrode to a voltage potential A, and setting a first inversion layer voltage potential to a voltage potential B lower than a voltage potential A, and then terminating the connection between the first inversion layer and the power supply to set a floating state, and forming a second inversion layer in the vicinity of the semiconductor surface by setting the second electrode to a voltage potential C, and then setting the voltage potential of the second inversion layer to a voltage potential D higher than the voltage potential B and lower than the voltage potential C, and by setting the voltage potential on the third electrode to a voltage potential E higher than the voltage potential C, and during precharge of the first inversion layer, the hot electrons emitted in the vicinity of the first electrode are injected into the charge holding means.

A semiconductor nonvolatile memory device including a first, second and fourth electrode mutually wired in parallel in a first direction, and a fifth electrode for controlling the voltage potential on the semiconductor surface between the first electrode and the second electrode, as well as between the second electrode and the fourth electrode, and the fifth electrode is wired in the second direction substantially perpendicular to the first direction, and a first charge holding means for holding an electrical charge enclosed by insulator film on the periphery between the first electrode and the second electrode, and a second charge holding means for holding an electrical charge enclosed by insulator film on the periphery between the second electrode and the fourth electrode, and moreover, an operating method wherein, by forming a first inversion layer in the vicinity of the semiconductor surface by setting the first electrode to a voltage potential A, and after setting the first inversion layer voltage potential to a voltage potential B lower than a voltage potential A, and terminating the connection between the first inversion layer and the power supply to set a floating state, and forming a second inversion layer in the vicinity of the semiconductor surface by setting the fourth electrode to a voltage potential C, and setting the voltage potential on the second inversion layer to a voltage potential D higher than the voltage potential B and lower than the voltage potential C, and setting the voltage potential on the second electrode to voltage potential E lower than the voltage potential A, and by setting the voltage potential on the fourth electrode to a voltage potential F higher than the voltage potential C, and during precharge of the first inversion layer the hot electrons emitted in the vicinity of the semiconductor surface between the second and the fourth electrodes, are injected into the second charge holding means.

A semiconductor nonvolatile memory device including a first and a second electrode mutually wired in parallel in a first direction, and a third electrode for controlling the voltage potential on the semiconductor surface between that first electrode and second electrode, and the third electrode is wired in the second direction substantially perpendicular to the first direction, and a charge holding means for holding an electrical charge enclosed on the periphery by insulator film between the first electrode and the second electrode, and moreover, an operating method wherein, by forming a first inversion layer in the vicinity of the semiconductor surface by setting the first electrode to a voltage potential A, and setting the first inversion layer voltage potential to a voltage potential B lower than a voltage potential A, and after setting the second electrode to a voltage potential C, and terminating the connection between the second electrode and the power supply to set a floating state, and setting the voltage potential on the second inversion layer to a voltage potential D lower than the voltage potential C and higher than the voltage potential B, and by then coupling the second electrode and the second inversion layer, after the voltage potential rises on the second electrode, the third electrode is set to a voltage potential E higher than the voltage potential C, and the hot electrons emitted in the vicinity of first electrode are injected into the charge holding means.

A semiconductor nonvolatile memory device including a first, second and fourth electrode mutually wired in parallel in a first direction, and a fifth electrode for controlling the voltage potential on the semiconductor surface between the first electrode and the second electrode, as well as between the second electrode and the fourth electrode, and the fifth electrode is wired in the second direction substantially perpendicular to the first direction, and a first charge holding means for holding an electrical charge enclosed by insulator film on the periphery between the first electrode and the second electrode, and a second charge holding means for holding an electrical charge enclosed by insulator film on the periphery between the second electrode and the fourth electrode, and moreover, an operating method wherein, by forming a first inversion layer in the vicinity of the semiconductor surface by setting the first electrode to a voltage potential A, and after setting the first inversion layer voltage potential to a voltage potential B lower than a voltage potential A, a second inversion layer is formed in the vicinity of the semiconductor surface by setting the fourth electrode to a voltage potential C, and after the setting the fourth electrode to a voltage potential C, terminating the connection between the fourth electrode and the power supply to set a floating state, and setting the voltage potential on the second inversion layer to a voltage potential D lower than the voltage potential C and higher than the voltage potential B, after the voltage potential on the fourth electrode has risen due to the coupling between the third electrode and the second inversion layer, and setting the voltage potential on the second electrode to a voltage potential E lower than the voltage potential A, and setting the fifth electrode voltage potential to a voltage potential F higher than the voltage potential C, the hot electrons emitted on the semiconductor surface between the second and the fourth electrodes are injected into the second charge holding means.

A semiconductor nonvolatile memory device including a first and a second electrode mutually wired in parallel in a first direction, and a third electrode for controlling the voltage potential on the semiconductor surface between that first electrode and second electrode, and the third electrode is wired in the second direction substantially perpendicular to the first direction, and a charge holding means for holding an electrical charge enclosed on the periphery by insulator film between the first electrode and the second electrode, and moreover, an operating method wherein, by forming a first inversion layer in the vicinity of the semiconductor surface by setting the first electrode to a voltage potential A, and setting the voltage potential on the first inversion layer to a voltage potential B lower than a voltage potential A, and setting the second electrode to voltage potential C, due to the coupling between the second electrode and the semiconductor surfaces in a floating state, in the vicinity of the second electrode, and the second inversion layer is formed at a voltage potential D lower than the voltage potential C and higher than the voltage potential B, and by setting the voltage potential of the third electrode to a voltage potential E higher than the voltage potential C, the electrical charges accumulated in the second inversion layer pass the semiconductor surfaces under the charge holding means, and during discharge to the first inversion layer, the hot electrons emitted in the vicinity of the first electrode are injected into the charge holding means.

A semiconductor nonvolatile memory device including a first, second and fourth electrode mutually wired in parallel in a first direction, and a fifth electrode for controlling the voltage potential on the semiconductor surface between the first electrode and the second electrode, as well as between the second electrode and the fourth electrode, and the fifth electrode is wired in the second direction substantially perpendicular to the first direction, and a first charge holding means for holding an electrical charge enclosed by insulator film on the periphery between the first electrode and the second electrode, and a second charge holding means for holding an electrical charge enclosed by insulator film on the periphery between the second electrode and the fourth electrode, and moreover, an operating method wherein, by forming a first inversion layer in the vicinity of the semiconductor surface by setting the first electrode to a voltage potential A, and setting the first inversion layer voltage potential to a voltage potential B lower than a voltage potential A, and setting the fourth electrode to a voltage potential C, and forming the second inversion layer in a state with the voltage potential D lower than the voltage potential C and higher than the voltage potential B due to coupling between the fourth electrode and the semiconductor surfaces in a floating state in the vicinity of the fourth electrode, and the second electrode voltage potential is set to a voltage potential E lower than the voltage potential A, and by setting the voltage potential on the fifth electrode to a voltage potential F higher than the voltage potential C, the electrical charges accumulated on the second inversion layer pass the semiconductor surface under the second charge holding means, the semiconductor surfaces under the second electrode, and the semiconductor surfaces under the first charge holding means, and during discharge to the first emitting layer, the hot electrons emitted on the semiconductor surfaces between the second and the fourth electrodes, are injected into the second charge holding means.

A semiconductor nonvolatile memory device wherein the charge holding means of the present invention is made up of polysilicon or many tiny silicon particles or is an insulator element containing an electrical charge trap.

A semiconductor nonvolatile memory device wherein the charge holding means of the present invention can comprise one or more bits of information.

The present invention is a semiconductor nonvolatile memory device with a tiny memory cell size and with few variations in cell programming characteristics.

DETAILED DESCRIPTION OF THE PREFERRED EMBODIMENTS

Figure 1:
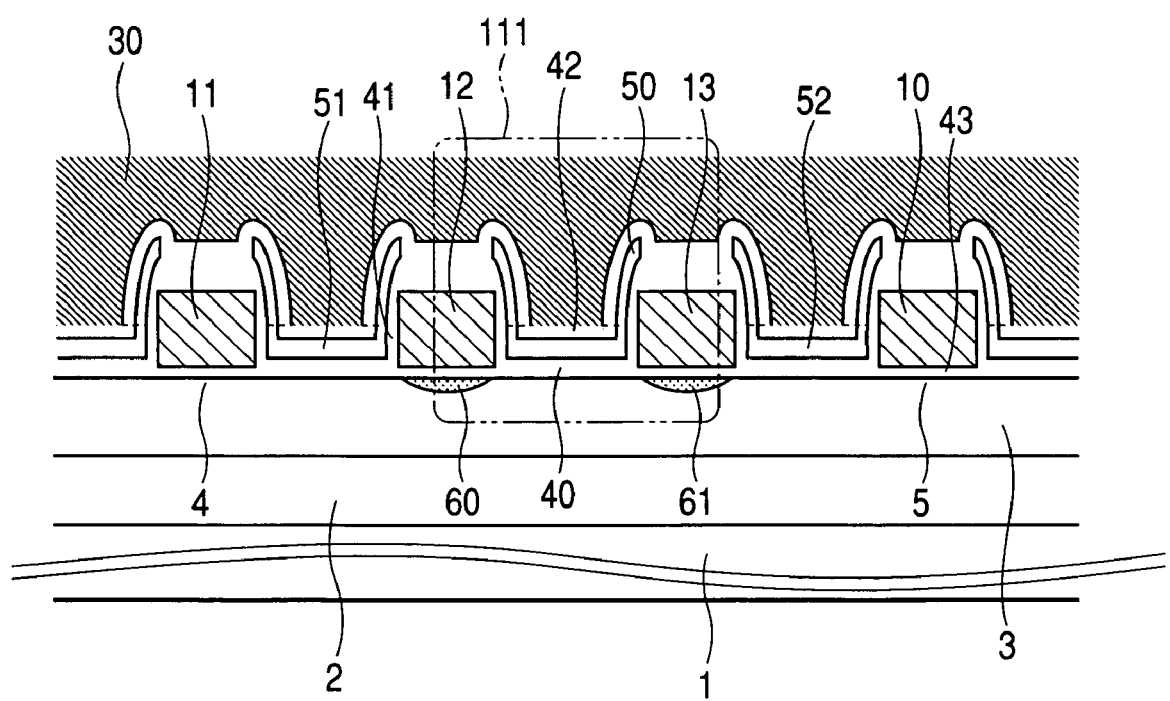
FIG. 1 is a cross sectional drawing for describing the first example.

The semiconductor device and semiconductor elements of the embodiments of the present invention are next described in detail.

The structure of the semiconductor device considered prior to the present invention is first described in items 1 and 2 below. The present invention in these specifications is an improvement on the basic structure of the semiconductor device.

1. A semiconductor memory device and operating method including a first and a second electrode mutually wired in parallel in a first direction, and a third electrode for controlling the voltage potential on the semiconductor surface between that first electrode and second electrode, and the third electrode is wired in the second direction substantially perpendicular to the first direction, and a charge holding means for holding an electrical charge enclosed on the periphery by insulator film between the first electrode and the second electrode, wherein an operating method that, by forming a first inversion layer in the vicinity of the semiconductor surface by setting the first electrode to a voltage potential A, and setting the first inversion layer voltage potential to a voltage potential B lower than a voltage potential A, and forming a second inversion layer in the vicinity of the semiconductor surface by setting the second electrode to a voltage potential C, and then setting the voltage potential of the second inversion layer to a voltage potential D higher than the voltage potential B and lower than the voltage potential C, and by setting the voltage potential on the third electrode to a voltage potential E higher the voltage potential C, the hot electrons emitted in the vicinity of the first electrode are injected into the charge holding means.

2. A semiconductor nonvolatile memory device and operating method including a first, second and fourth electrode mutually wired in parallel in a first direction, and a fifth electrode for controlling the voltage potential on the semiconductor surface between the first electrode and the second electrode, as well as between the second electrode and the fourth electrode, and the fifth electrode is wired in the first direction and in a direction substantially perpendicular to the second direction, and a first charge holding means for holding an electrical charge enclosed by insulator film on the periphery between the first electrode and the second electrode, and a second charge holding means for holding an electrical charge enclosed by insulator film on the periphery between the second electrode and the fourth electrode, and including an operating method wherein, by forming a first inversion layer in the vicinity of the semiconductor surface by setting the first electrode to a voltage potential A, and setting the first inversion layer voltage potential to a voltage potential B lower than a voltage potential A, and forming a second inversion layer in the vicinity of the semiconductor surface by setting the fourth electrode to a voltage potential C, and then setting the voltage potential of the second inversion layer to a voltage potential D higher than the voltage potential B and lower than the voltage potential C, and setting the voltage potential on the second electrode to voltage potential E lower than the voltage potential A, and by setting the voltage potential on the fifth electrode to a voltage potential F higher than the voltage potential C, the hot electrons emitted on the semiconductor surface between the second and fourth electrodes are injected into the second charge holding means.

The above examples (items) are more specifically described next with the first example (or example 1) shown in FIG. 1. Here, FIG. 1 is a drawing showing the cross sectional structure of the memory element of the embodiment. An n-type well region (2) is formed on the p-type silicon substrate (1) and a triple well structure formed with a p-type well region (3) is formed inside. The auxiliary electrodes (10) (11) (12) (13) for controlling the voltage potential on the silicon substrate surface are made from N-type polysilicon. A control electrode (30) formed as a laminated structure of N-type polysilicon and W (tungsten) is formed on the substrate. The control electrode (30) is also used for the word line. Memory nodes (50) (51) (52) made from polysilicon are formed in a shape that covers the side walls (41) of the auxiliary electrodes (10) (11) (12) (13) by way of the insulator film (40) made from $SiO_2$ formed on the surface of the silicon substrate. An $SiO_2$ film (42) is formed between the control electrode (30) and the memory nodes (50) (51) (52). An $SiO_2$ film (43) is also formed between the auxiliary electrodes (10) (11) (12) (13) and the silicon substrate. This type of structure is repeated throughout the memory cell array. A feature of this cross section is that there are no grooves embedded with the insulator film usually formed on the isolation regions. The substrate surface below the auxiliary electrodes (10) (11) (12) (13) and the substrate surface below the memory nodes (50) (51) (52) are made from impurities of different concentrations.

Figure 2:
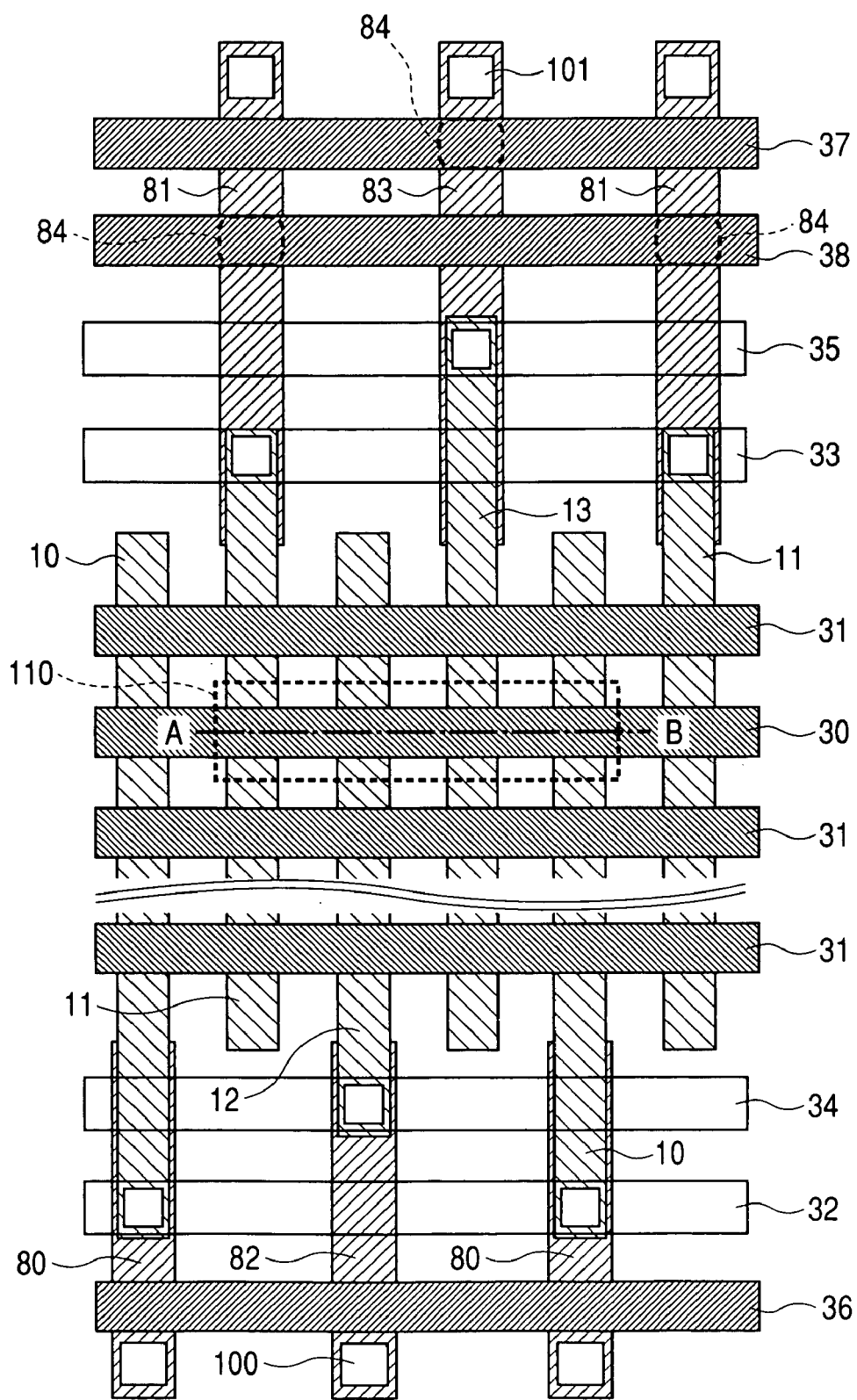
FIG. 2 is a top view drawing for describing the first example.
Figure 3:
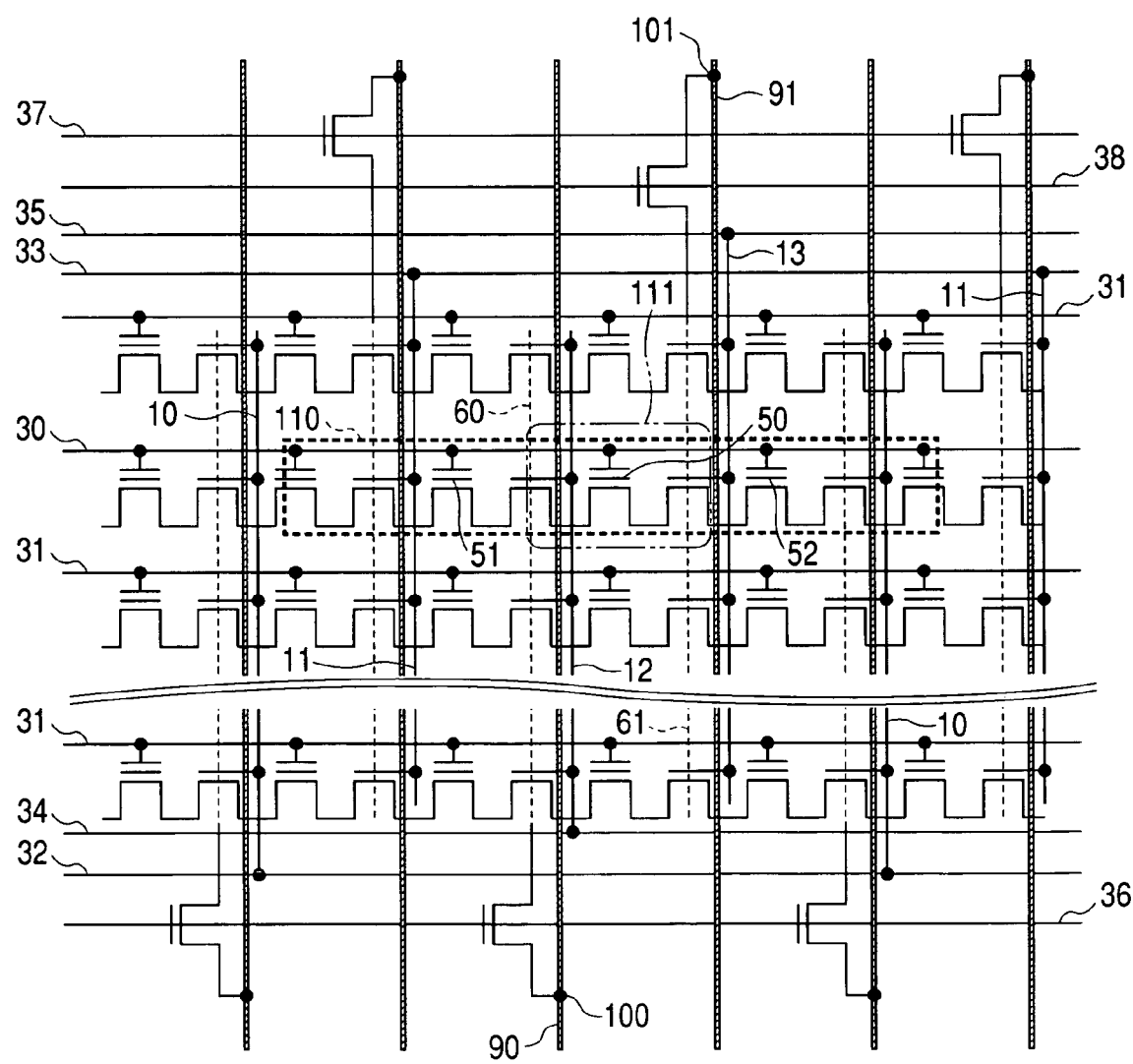
FIG. 3 is a circuit diagram for describing the first example.

FIG. 2 is a top view and FIG. 3 is a circuit diagram showing the equivalent circuit. The wiring for the inversion layer is shown in FIG. 3 by the dashed (broken) lines. The auxiliary electrode wiring and the diffusion layer wiring for highly concentrated impurities are shown by the solid line. Except for essential sections, the metal wiring (layer) is omitted for convenience in this description. The A-B cross section for the section (110) enclosed by the dotted lines corresponds to FIG. 1. The word lines in the Y direction on the drawing are basic units (hereafter called a memory mat) in a repeating structure comprised for example of 128 or 256 repeating lines. The auxiliary electrodes (10) (11) (12) (13) are combined in four points (32) (33) (34) (35) each at both ends (of the word lines), and separate voltages can be applied to adjoining auxiliary electrodes. Grooves are embedded with the isolation region insulator film at these ends, and the active regions (80) (81) (82) (83) are mutually insulated. The inversion layers (60) (61) formed when reading or programming the memory node (50) information, are respectively connected to the active regions (82) (83). The gate electrodes (36) (37) (38) between the contact structures (100) (101) connecting to the wiring and these active regions, form the MOS transistors used for selection. However the section for (84) is formed as a depression and is in a state capable of conduction even if a voltage is not applied to the gate electrodes (36) (37) or (38). The local bit lines (60) (61) comprised of inversion layer wiring via these selection MOS (transistors) are connected to the global data lines (90) (91). The active regions (80) (81) (82) (83) that conduct to the auxiliary electrodes (10) (11) (12) (13) and N-type impurities are characterized in having respective overlapping structures. However, the auxiliary electrodes and the active regions are insulated by insulator film formed on the substrate surface.

In this type of structure, for example when a positive voltage is applied to the auxiliary electrode (13) and an inversion layer (61) is formed on the substrate surface below the gate, a voltage potential can be applied to the inversion layer (61) from the global data line (91) via the active region (83). A global data line and a contact structure for supplying a voltage potential to the region doped with the N-type impurity and its overlapping region, are formed in the same way for the other auxiliary electrodes.

The operation of this example is described next. The storage of two bits utilizing four level thresholds in the memory node (50) between the auxiliary electrodes (12) (13) is performed here.

In giving a description utilizing the general explanation shown for item 1 above, the auxiliary electrodes (12) (13) are respectively equivalent to the first and the second electrodes. The relation to the general explanation is hereafter given by appending parentheses. A value for example of eight volts as the voltage potential value in the parenthesis, does not indicate a code letter such as "voltage potential C" for the voltage potential. The voltage potential C signifies the voltage potential applied to the second electrode. The same explanation is hereafter appended to the item 2 and each embodiment.

The programming operation is described first. The correspondence between threshold levels and bit information are established as shown in Table 1. Here, V3>V2H>V2L>V1H>VIL>V0H>V0L. The 2 bit information of "0" and "1" and the threshold level can be made to correspond differently than Table 1. The sequence for the programming threshold level may be any desired sequence however in the present embodiment, the programming is performed in a sequence from the high level.

Figure 4:
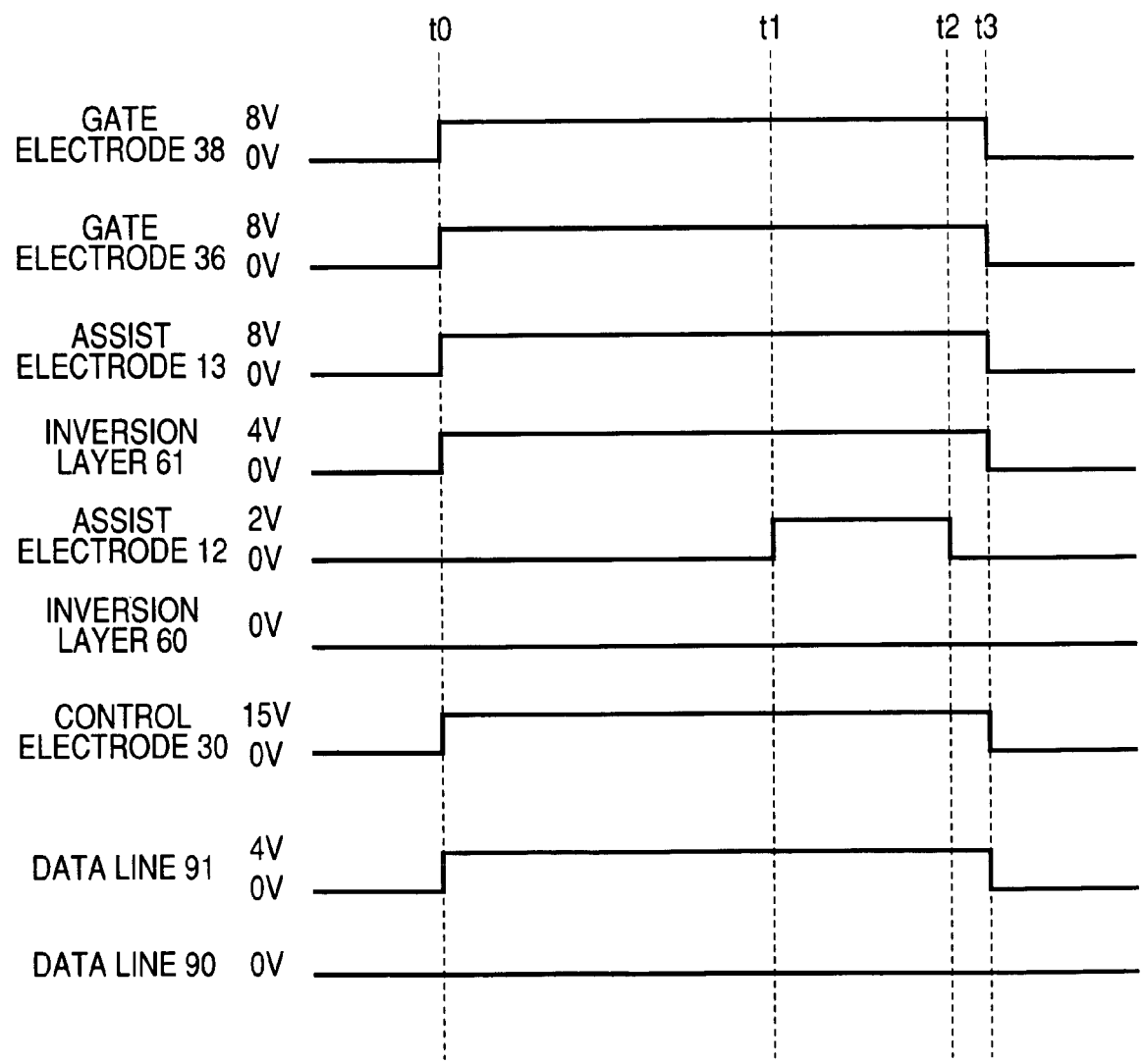
FIG. 4 is a timing diagram for describing the programming operation of the first example.
Figure 5:
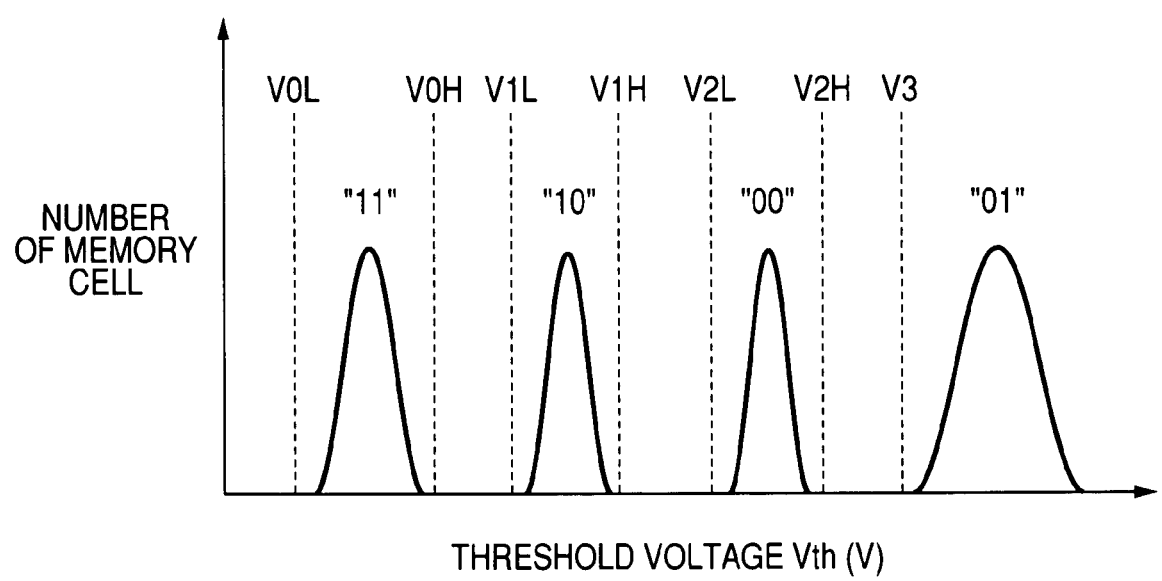
FIG. 5 is a graph showing the threshold distribution.
Figure 6:
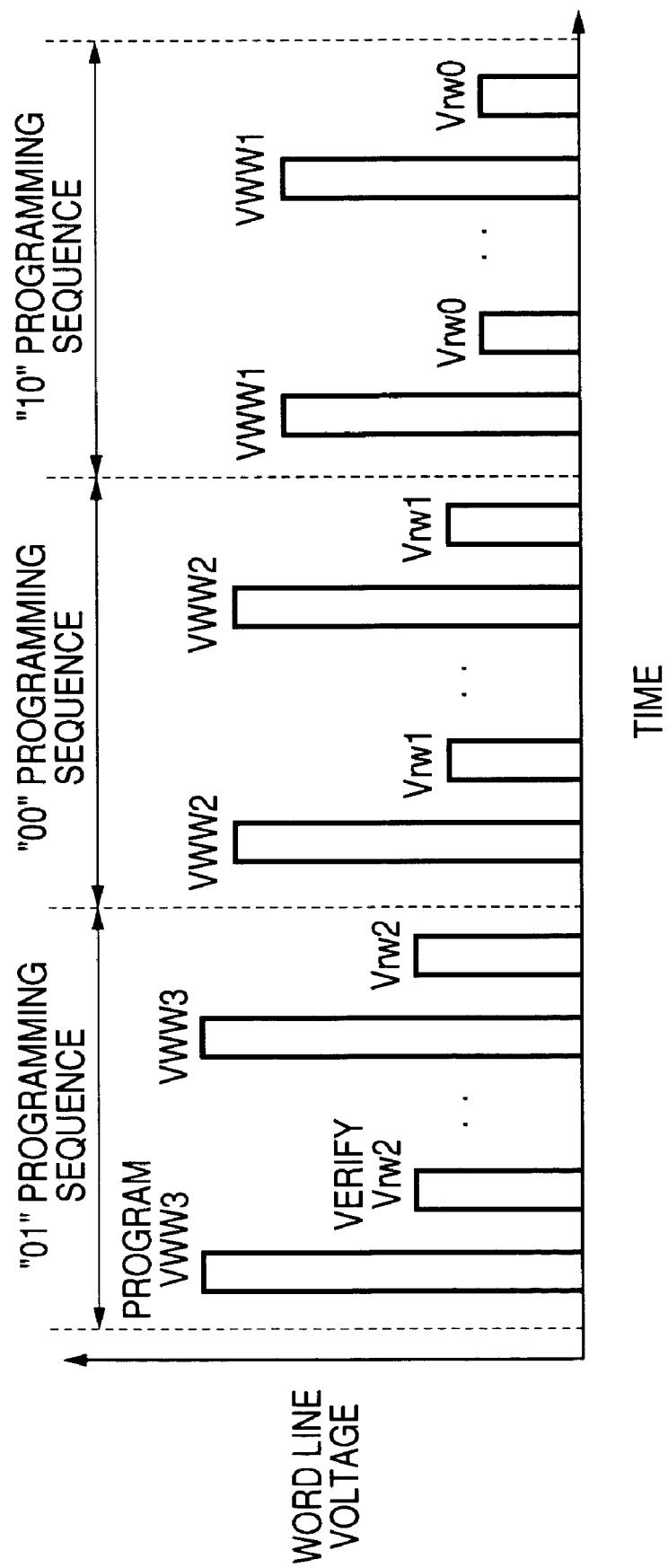
FIG. 6 is a graph for describing the interrelation of the word voltage and time during programming in the first example.

The programming procedure is shown next while referring to FIG. 4 through FIG. 6. When for example, the information to write in the corresponding memory cell (111) is "01", a positive voltage (for example 8 volts) is applied to the auxiliary electrode (13) (second electrode) at the time t0, and a low resistance inversion layer (61) (second inversion layer) is formed on the substrate surface under the auxiliary electrode (13). The gate electrodes (38), gate electrode (36) are respectively raised to 8 volts, and the control electrode (30) raised to Vww3 (for example 15 volts). The data line (91) is raised to 4 volts (voltage potential D). The data line (90) is fixed at 0 volts (voltage potential B) at this time. The auxiliary electrode (10) (11) on the outer adjacent side of the memory cell (111) is set to a low voltage level (for example 0 volts) so as not to form an inversion layer, and the isolation regions electrically formed. During forming of the second inversion layer (61), the N-type diffusion region (83) and the inversion layer (61) conduct, the contact structure (101) formed in the diffusion layer region conducts, and a voltage can be applied from the global data line (91). The second inversion layer (61) therefore reaches 4 volts (voltage potential D). Next, at the time t1, when the auxiliary electrode (12) (first electrode) rises to a voltage level (for example 2 volts) (voltage potential A) capable of forming an inversion layer (60) (first inversion layer) with high resistance, a programming current flows via the data line (90), diffusion layer region (82), inversion layer (60), the channel formed below the memory node (50) inversion layer 61, diffusion layer region (83) and data line (91). A concentrated electrical field occurs at this time at the boundary of the inversion layer below the control electrode (30) and the inversion layer (60) (first inversion layer) below one end of the auxiliary electrode (12), and hot electrons are emitted. These hot electrons that are emitted are attracted towards the control electrode (30) due to the high voltage potential of the control electrode (30). These hot electrons jump the potential barrier of the tunnel insulator film (40) and are injected into the memory node (50).

The resistance of the inversion layer (60) below the one end of the auxiliary electrode (12) is high so that the current flowing through the inversion layer wiring ((60) and (61)) is not very large and a large percentage of the current flow can be taken up by the quantity of electrons injected into the memory node. Therefore the current will not be very large even during programming operation that simultaneously programs many cells and so is ideal for file applications that input and output large quantities of bits at one time. The unselected word line (31) is clamped at a sufficiently low voltage (for example 0 volts), and if the channel of the memory cell driven by the unselected word line does not conduct, then information is not programmed. At time t2 the auxiliary electrode (12) deactivates, and the injection of hot electrons to the memory node (50) ends. Next, at time t3, the gate electrodes (36) (38), auxiliary electrodes (13), control electrodes (30), and data line (91) deactivate to 0 volts. One cycle of the programming sequence is now complete.

The read operation is then performed, and a check made to determine if the threshold value Vth has become higher than V3. The read operation is described in detail later on. If the information to be programmed (written) is "01" and if the threshold value Vth has not become higher than V3, then it is once again set to the specified voltage and the previously described programming sequence is repeated. The read check operation is then performed again and if necessary, the sequence for repeating the programming sequence is repeated.

In this array structure the adjacent cells are electrically isolated so that among the multiple cells driven by the same word line (30), every forth cell of the auxiliary electrodes can perform programming on the same side and at the point in time where all these cells for programming have passed the programming check, then the programming sequence "01" ends. In cells where programming is not performed, 2 volts are applied to the inversion layer formed beneath the auxiliary electrode for each cell with operation equivalent to the auxiliary electrode (12). As a result of applying this 2 volts, no inversion layer is formed beneath the auxiliary electrode and the electrode is in cutoff state where programming is not selected. An alternative is to apply 0 volts to the inversion layer formed beneath the auxiliary electrode of cells with equivalent operation on the inversion layer (13) so that no concentrated electrical field is generated and programming is not selected.

Operation next shifts to the "00" programming sequence. If the information to be written in a cell for programming is "00", then a specified voltage is set, and the above described programming sequence is repeated. However, if the voltage Vww2 on the word line (30) is a voltage lower than Vww3, then 12 volts for example is used. In this way, the injected electrical charge quantity is small even when utilizing a pulse width identical to that when programming "01", so that programming can be performed at a lower threshold value. The check is performed in the same way but the point of difference is that the threshold value must be set to a value higher than V2L and lower than V2H. Here, the initial programming pulse is set so as not to inject an excessive electrical charge and the pulse width from the second pulse onward is set to a small width to avoid injecting an excessive electrical charge. The "00" programming sequence ends at the point in time that all cells for programming have passed the check, and the operation shifts to the "10" programming sequence. In the programming of "10", other than using a lower voltage than Vww2 for the programming voltage Vww1, for example 10 volts, and using a different target threshold range, the operation is the same as for programming "00". The programming sequence for "01" is performed afterwards and the operation for writing this cell then ends.

In the programming (or writing) of each information here, the voltage for the programming pulse applied to the word line (30) by way of the sequence is a fixed value. However, the programming sequence can be finished in a short time by utilizing a pulse string that applies a higher voltage as the count increases. Also in the programming operation described here, the substrate surfaces (4) (5) beneath the unselected auxiliary electrodes (11) (10) utilize electrical isolation so that unless a large negative voltage is used when the threshold voltage is low, a cutoff state cannot be attained. On the other hand, the voltage drop is preferably low on the substrate surface below the memory nodes (50) (51) (52). Therefore the threshold voltage should to some extent preferably be low. The P-type impurity concentration in the substrate surface below the auxiliary electrode is therefore set higher than the P-type impurity concentration in the substrate surface below the memory node.

The read operation is described next. Here, the information programmed into the memory node (50) described in the explanation of the programming operation is read. A specified voltage Vs (for example 0 volts) is applied to the data line (90) for supply to the inversion layer, and the voltage potential Vs of the auxiliary electrode (12) is set to voltage potential Va (for example 3 volts) larger than Vs. An inversion layer (60) is formed beneath the auxiliary electrode (12), and the voltage potential of that inversion layer (60) is set to approximately Vs. The voltage potential of the auxiliary electrodes (10) (11) for the unselected cell, is set to a low voltage potential Van (for example 0 volts) that will not form an inversion layer on the substrate surfaces (4) (5) beneath the electrode. The electrical conduction between the select cell and the unselected cell is in this way eliminated. To read out the 4 levels, a decision is made whether the threshold level is a level "00" or more or in other words is V2L or more, or is a level of "10" or less or in other words, is V1H or less. The voltage potential of the inversion layer (61) is precharged to a high voltage potential Vdr (for example, 1 volt) via the global data line (91).

A voltage Vrw1 comprised of V1H<Vrw1<V2L is then applied to the control electrode (30). There is a conducting state between the inversion layer (60) and the inversion layer (61) if the threshold level of the memory cell is V1H or less, and current flows in the global data line (90) joining the global data line (91) to the inversion layer (60). For V2L or more, the state is a non-conducting state or is a high resistance state. If this result is V1H or less then a voltage Vrw0 comprised of V0H<Vrw0<V1L is applied to the control electrode (30) after precharge, and the differential in electrical current flow is utilized to decide if (the information) is "11" or "10". If the initial read-out result is V2L or more then the voltage added to the control electrode (30) after precharge is a voltage Vrw2 comprised of V2H<Vrw2<V3. The differential in electrical current flow is utilized to decide if (the information) is "00" or "01". In the above readout operation, rather than changing the conditions for applying voltage by utilizing the results of Vrw1, a method can also be used that reads out information from all readout operations with Vrw0, Vrw1, Vrw2. In contrast to the former method that became faster with two voltage applications, the latter method requires three readout operations but offers the feature that the control circuit can be simplified. In this operating method, every other global data line is driven during readout. By clamping the voltage potential of both global data lines adjoining the global data line being driven, the global data lines being driven are electrically shielded and stable readout operation is achieved. The read-out drain voltage can be set to small voltage of approximately one volt.

Information erasure is performed at one time on all the multiple cells driven on the same word line. A large negative voltage (for example −18 volts) is applied to the word line. The voltage potential drops on the memory node where the electrons are injected, and a strong electrical field is applied to the tunnel insulator film (40). The electrons are consequently pulled to the P-type well (3) and the memory cell threshold drops. A different method may also be used for erasure. For example, a positive voltage Vew (for example 20 volts) larger than Vww3 can be applied to the word line to pull (electrons) to the control electrode side.

In the above example, the well (3) was the P-type and electrons were used as the carrier. However an N-type well may be used and holes may be utilized as the carriers. In this case, the voltage sizes will be reversed. The above is also true for the other embodiments.

In this example, the memory nodes were formed from polysilicon, however other semiconductors or metals may be utilized. Also, many tiny particles of silicon may be utilized instead of the one piece of polysilicon on this example. Moreover, tiny particles comprised of an insulator element (for example SiN) containing an electrical charge trap may be used. When using the tiny particles of silicon or an insulator element containing an electrical charge trap, the laminated electrical charge accumulator section can hold electrical charges in two isolated locations near the respectively adjoining auxiliary electrodes, and multilevel storage achieved by the difference in the locations for accumulating the electrical charges.

The present example utilized an $SiO_2$ film in the interlayer film (42) between the memory node (50) and the control electrode (30), however an $SiO_2$ film of nitrogen additive may be used. Rather than simply an $SiO_2$ film, this nitrogen-added film has the feature that there are few fluctuations in characteristics and traps are not prone to occur during programming and erasure. A laminated structure of $SiO_2$ and silicon nitride films may also be used. These laminated films have the feature (or advantage) that electrical current is relatively less prone to flow when high electrical fields are applied and also that the memory element as expected, has excellent reliability. The information related above for memory node structure and interlayer film structures is also the same for all other examples and also all other embodiments of the present invention in this application. In the present example, two bits were stored in 4 threshold levels in the memory node (50). Needless to say however, one bit may also be stored. The memory structure in this example, can be fabricated with a small pitch between the auxiliary electrode wirings because there is no diffusion layer wiring formed by impurities in the memory cell array. The memory cell therefore has a small surface area and the memory can be produced at a low cost.

The second example (example 2) is described next.

Figure 7:
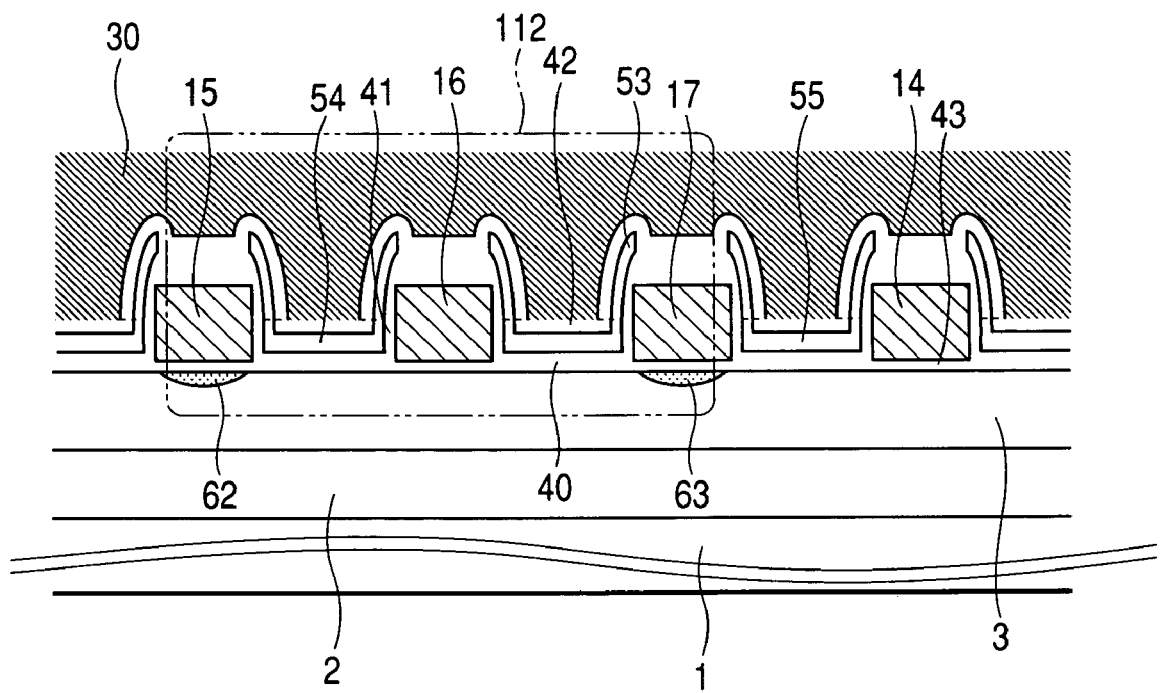
FIG. 7 is a cross sectional drawing for describing the second example.
Figure 8:
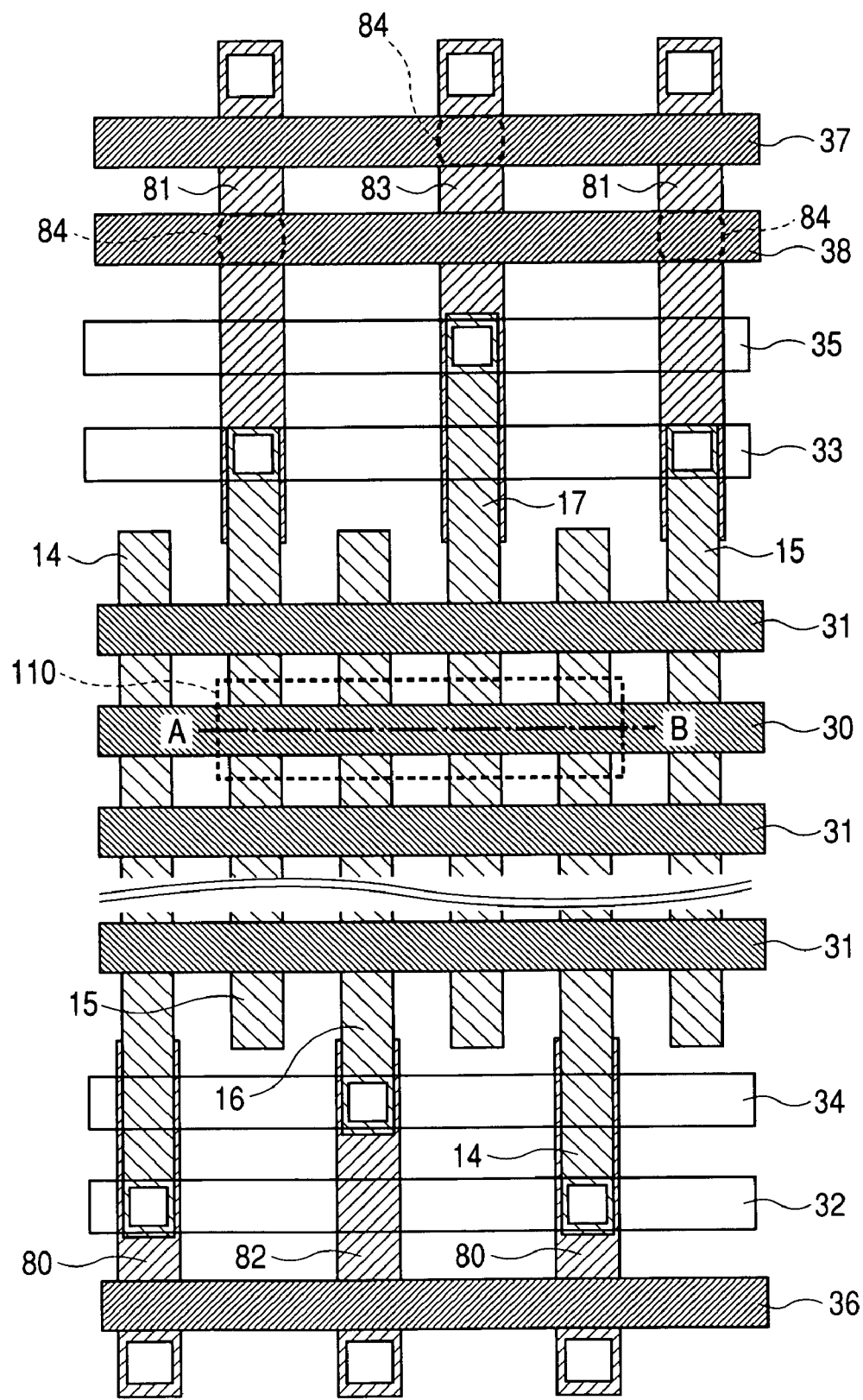
FIG. 8 is a top view drawing for describing the second example.
Figure 9:
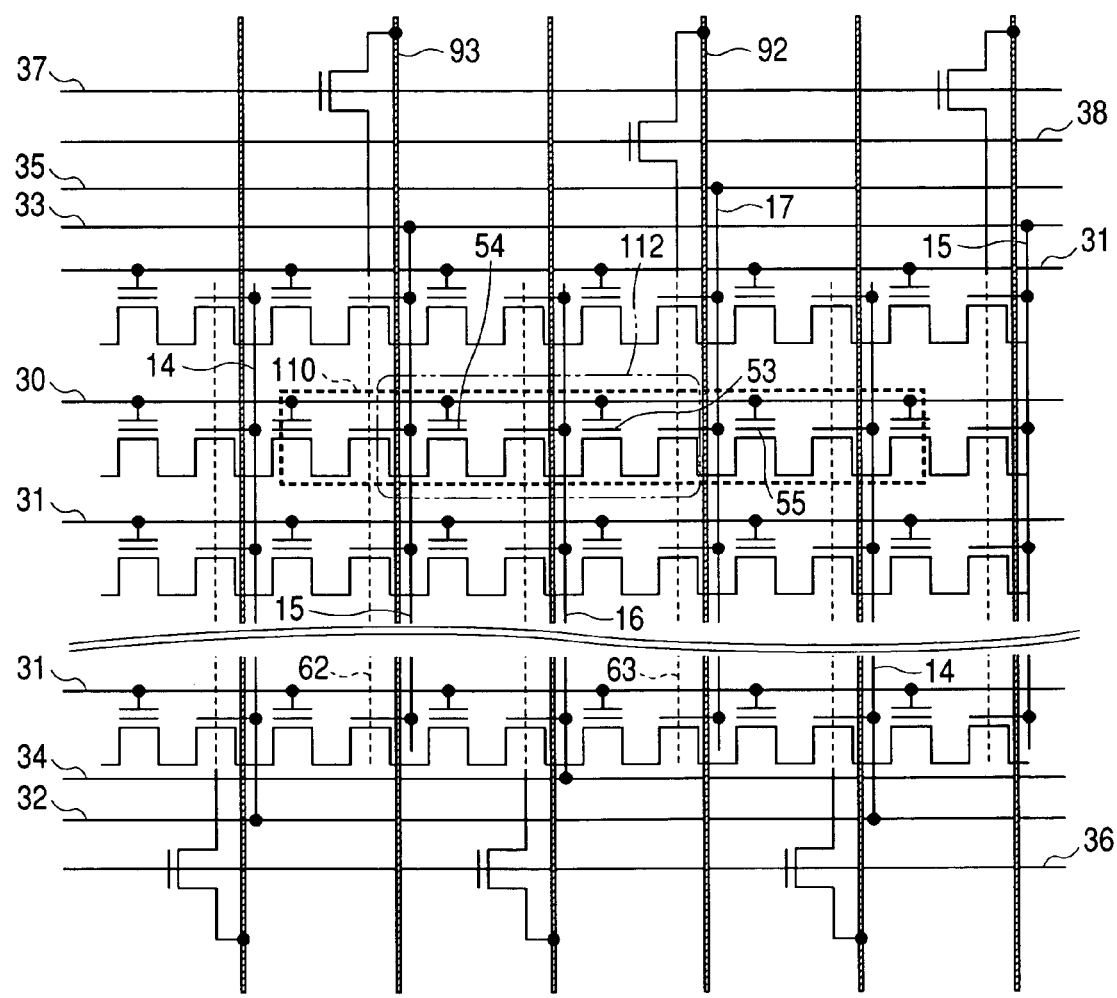
FIG. 9 is a circuit diagram for describing the second example.

The second example (example 2) is described next while referring to FIG. 7 through FIG. 9. FIG. 7 is cross sectional view, FIG. 8 is a top view, and FIG. 9 is an equivalent circuit diagram of the second example. The cross sectional view, and the top view of the second example are both identical to the first example (example 1) however the operating method is different. Numbers are added as needed, to sections essential to the description. In the present example, the reason that variations in programming can be reduced compared to the first example is because the distance to the contact is different due to the position of the memory cell.

The programming operation of the second example differs greatly from that of the first example. In the first example (or example 1) programming operation was performed on the adjacent auxiliary electrodes (12) (13) and these were isolated from the adjacent auxiliary electrodes (10) (11). However the second example is characterized in that the programming operation is performed with three adjacent (15) (16) (17) electrodes.

Figure 10:
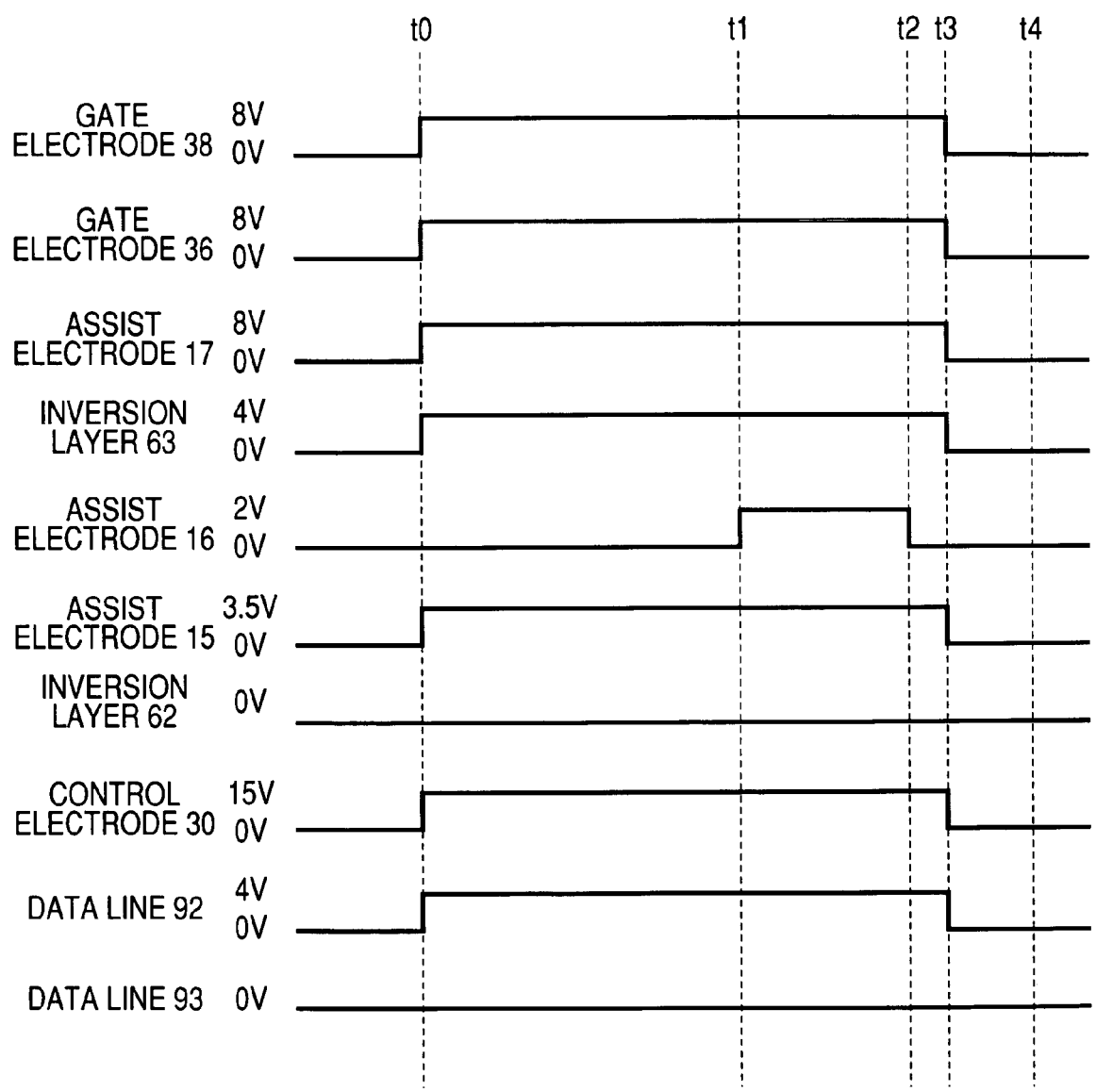
FIG. 10 is a timing diagram for describing the programming operation of the second example.
Figure 11:
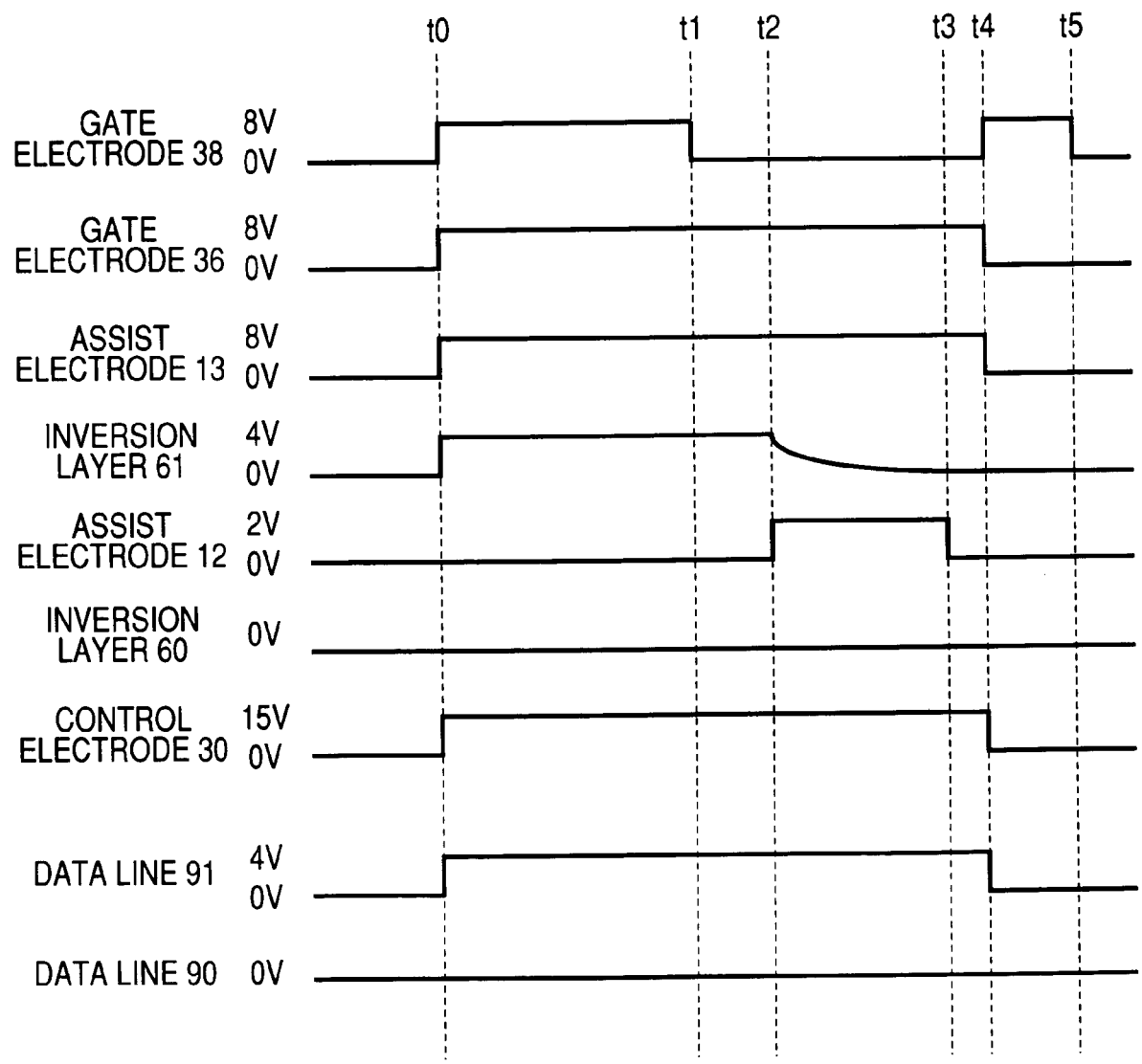
FIG. 11 is a timing diagram for describing the programming operation of the first embodiment of the present invention.
Figure 12:
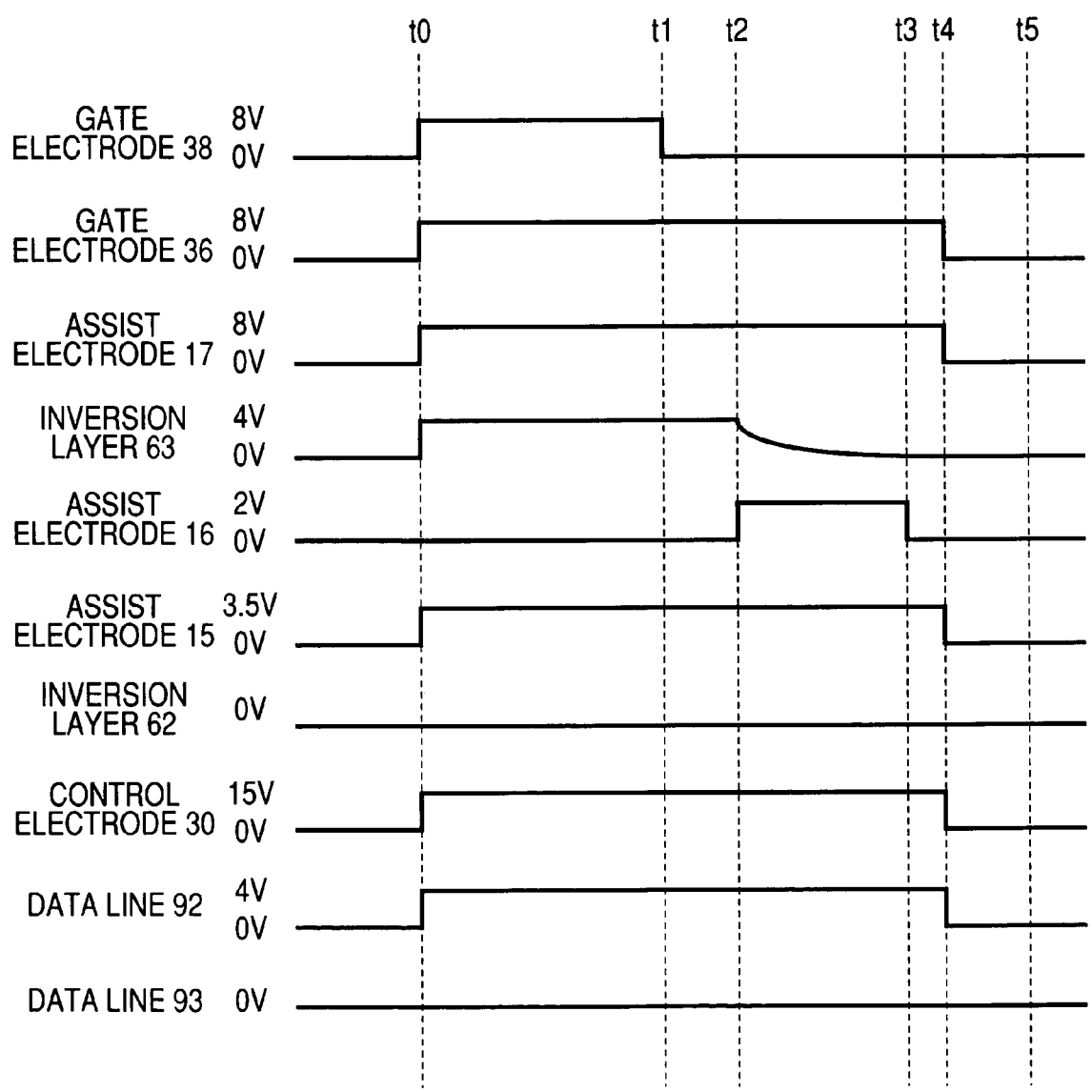
FIG. 12 is a timing diagram for describing the programming operation of the second embodiment of the present invention.
Figure 13:
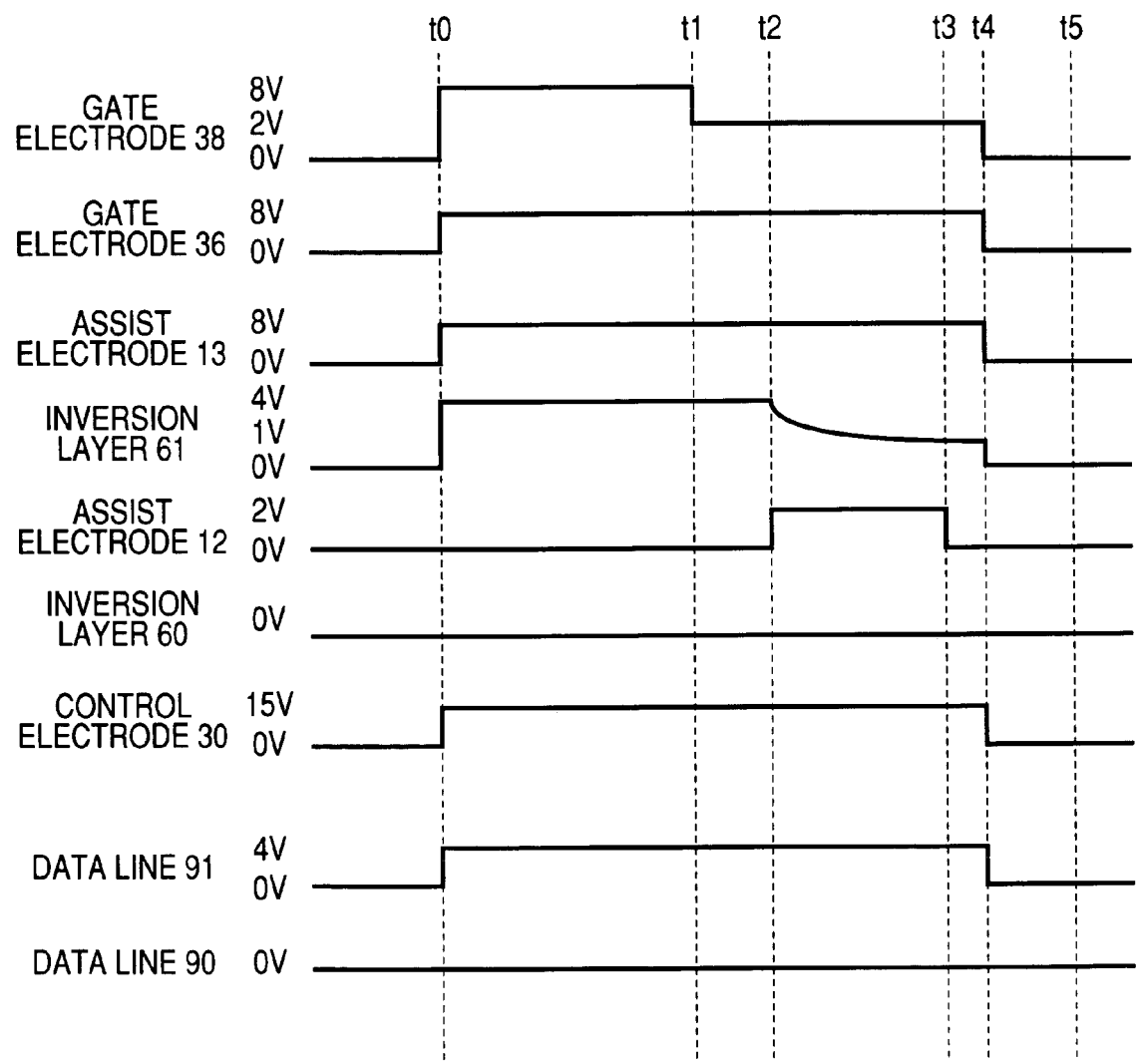
FIG. 13 is a timing diagram for describing the programming operation of the third embodiment of the present invention.
Figure 14:
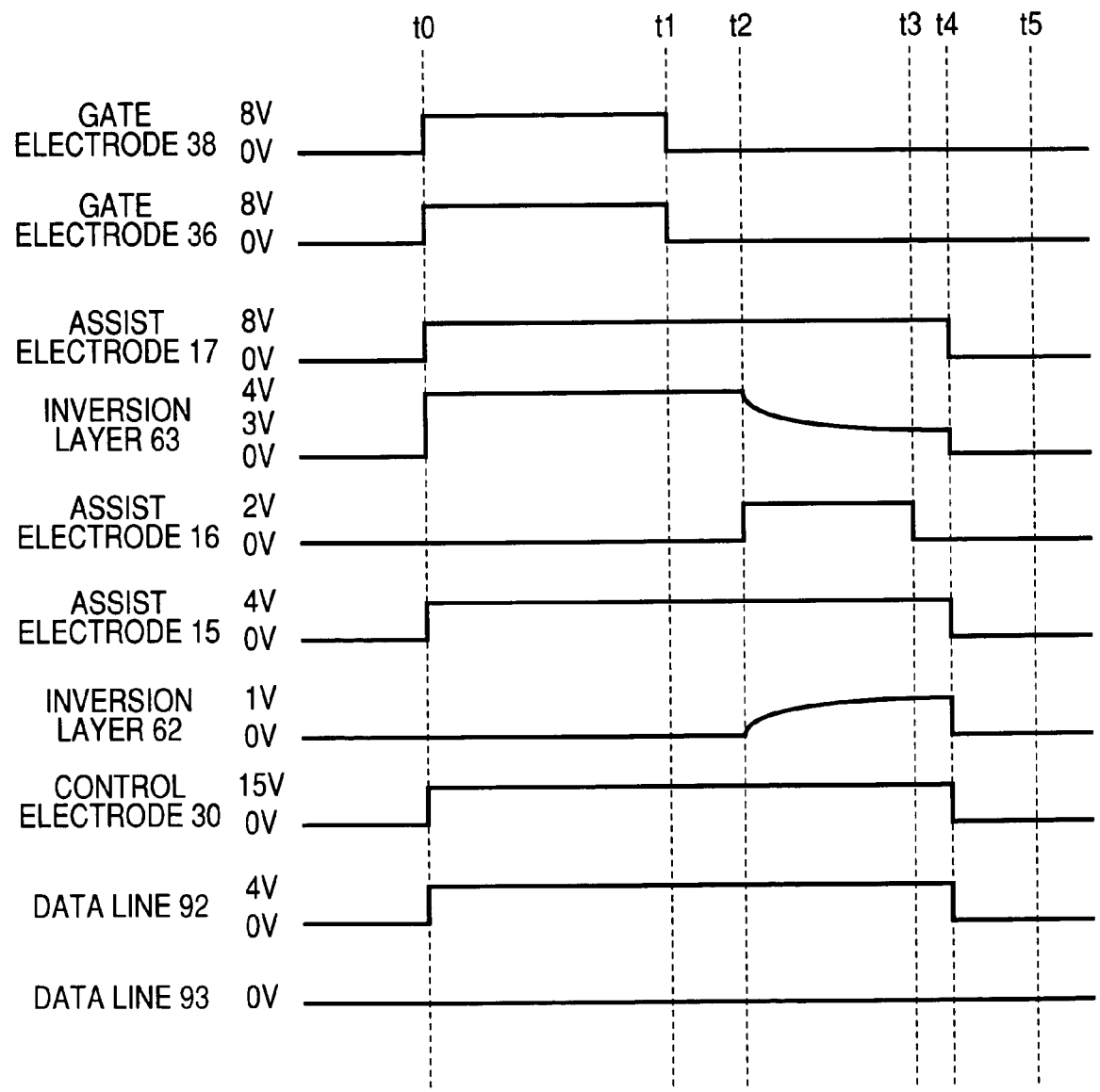
FIG. 14 is a timing diagram for describing the programming operation of the fourth embodiment of the present invention.
Figure 15:
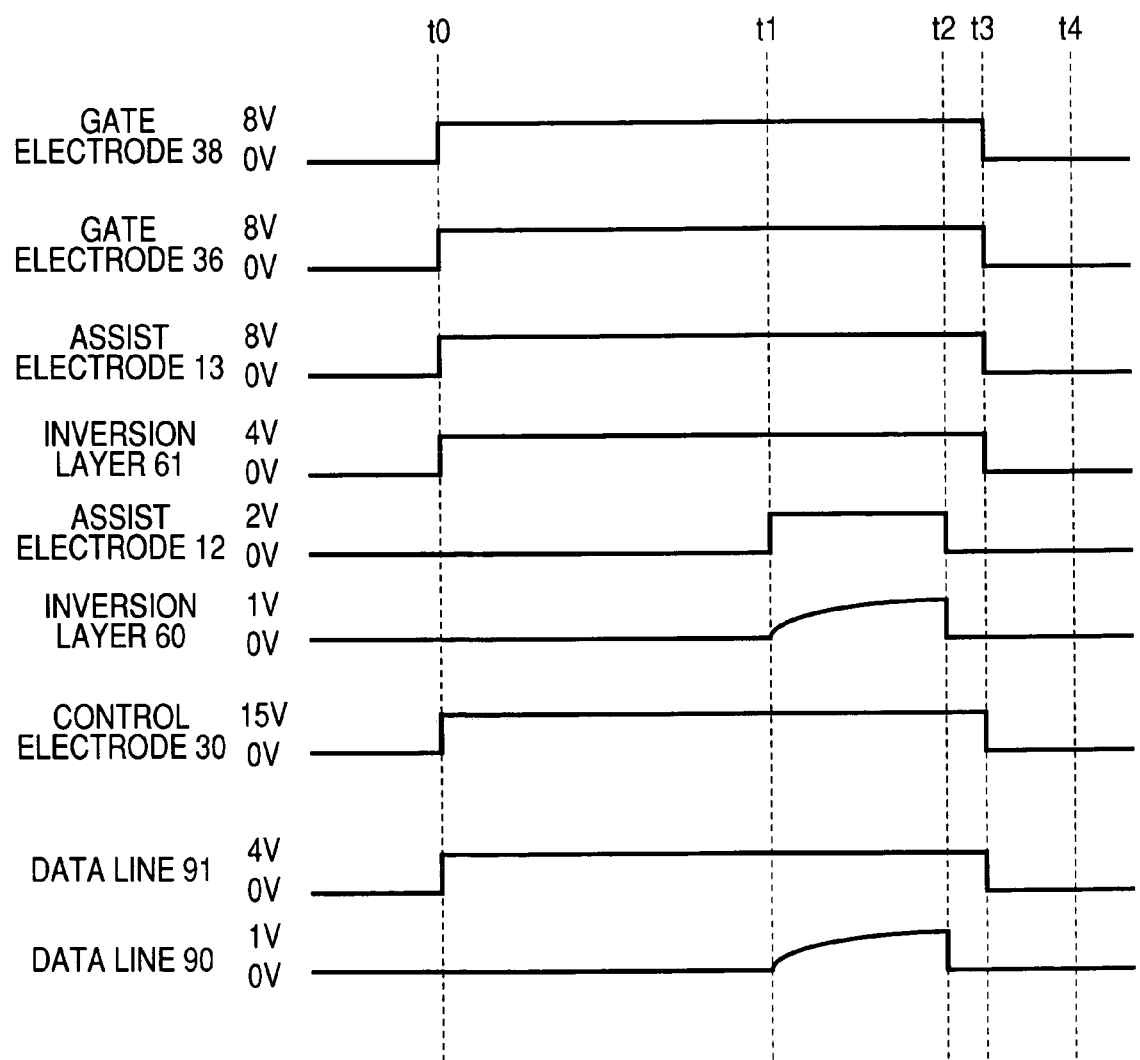
FIG. 15 is a timing diagram for describing the programming operation of the fifth embodiment of the present invention.

The programming sequence is described in detail while referring to FIG. 10. At time T0, the auxiliary electrode (17) (fourth electrode) is raised to 8 volts (voltage potential C), the auxiliary electrode (15) (first electrode) is raised to 3.5 volts (voltage potential A). The control electrode (30) (fifth electrode) is simultaneously raised (activated) to a high positive voltage (for example 15 volts) (voltage potential F), the gate electrodes (36) (38) are respectively raised (activated) to 8 volts, the data line (92) is raised to 4 volts, and the data line (93) clamped to 0 volts. Four volts (voltage potential D) is consequently supplied to the inversion layer (63) (second inversion layer), and 0 volts (voltage potential B) is supplied to the inversion layer (62) (first inversion layer). Unlike in the first example, there is no need to set the other inversion layer (62) to a high resistance. Next, at time t1, the center auxiliary electrode (16) (second electrode) is set to a comparatively low voltage potential (for example 2 volts) (voltage potential E), and when the voltage potential of the substrate surface below the -electrode is set to a high resistance conducting state, an electrical field concentrates below the right end of the auxiliary electrode 16, and just as in the first example, hot electrons are emitted and information is stored in the memory node (53) on the right of the center auxiliary electrode (16).

The voltage settings on both ends of the auxiliary electrodes (15) (17) and on both ends of the inversion layer (62) (63) may be interchanged when programming the storage area (54) on the left of the center auxiliary electrode (16). Moreover, the auxiliary electrodes (15) (17) used as the auxiliary electrodes for both ends in the above operation, can be set as the center auxiliary electrodes for the programming operation. With (15) set as the center electrode, programming (writing) can be performed on this right area, and programming (writing) can be performed on the left area (53) with (17) as the center electrode.

In the programming operation of the first example, the low voltage potential inversion layer (for example 60) is set to a high resistance, and an electrical field can concentrate on this end, so that the problem occurs of changing resistance values on the source side inversion layer due to the distance from the memory cell contact. In the second example, however a high resistance region is formed by the center electrode so that there is a drastic decrease in variations (irregularities) due to this dependence on the distance from the memory cell contact. In cells where programming is not performed, 2 volts is applied to the inversion layer formed beneath the auxiliary electrode of each cell with operation equivalent to the auxiliary electrode (15). Consequently, no inversion layer is formed beneath the auxiliary electrode of each cell with operation equivalent to the auxiliary electrode (16), a cut-off state is reached, and operation is at program unselect. If zero volts is applied to the inversion layer formed beneath the auxiliary electrode of each cell with operation equivalent to the inversion layer (17), then there is no concentrated electrical field and operation is in program unselect. Other than this difference in programming operation, the operation is the same as the first example and two bits of information are stored in the memory node (53).

Read and erase operation is performed the same as in the first example.

In the present example, the well (3) was the P-type and electrons were used as the carrier. However an N-type well may be used and holes may be utilized as the carriers. In this case, the voltage sizes will be reversed. The above is also true for the other embodiments. In the present example, two bits were stored in 4 threshold levels in the memory node (50). Needless to say however, one bit may also be stored.

The memory structure in this example, can be fabricated with a small pitch between the auxiliary electrode wiring since there is no diffusion layer wiring formed by impurities (doping) in the memory cell array. The memory cell therefore has a small surface area and the memory can be produced at a low cost. The source side inversion layer has low resistance because programming variations due to dependence on the distance from the memory cell contact are drastically reduced and high speed programming (write) is possible.

The embodiment of the present invention is described next based on the basic semiconductor nonvolatile memory device previously described.

First Embodiment

The first embodiment of the present invention is described next while referring to FIG. 1 through FIG. 3, and FIG. 11. The program operation in the present embodiment is different from the first example (example 1).

In the program operation on the memory cell shown in the first example, the substrate surface below the auxiliary electrode (12) (first electrode) was in a high-resistance conducting state (first inversion layer) so that the auxiliary electrode (12) was set to a comparatively low voltage potential and operated in the sub-threshold region. Variations or irregularities in the auxiliary electrode dimension and variations in the applied voltage therefore greatly effect the program characteristics of the memory cell. For example, if the thickness of the gate oxide film below the auxiliary electrode is 9 nm, then a variation of ±0.1 volts in the auxiliary electrode voltage will cause a change equal to approximately one decimal place in the quantity of electrons injected into the memory node. Also, the internal power supply for supplying channel current is operating during programming so that the voltage potential of the auxiliary electrode might change due to effects of noise from the internal power supply. Since the memory cell program (write) characteristics are greatly affected by the auxiliary electrode voltage as described previously, then even a tiny drive noise from the internal power supply might cause a fluctuation (variation) in characteristics.

During the program sequence, a program bias (voltage) is applied and the threshold value is repeatedly checked until the values of all memory cells simultaneously being programmed have reached the desired value. So if there are variations in the memory cell characteristics, then the number of program bias voltage applications and threshold level checks will increase so that the programming time becomes long. Therefore variations in the auxiliary electrode dimensions or variations in the voltage applied to the auxiliary electrode can be expected to greatly lengthen the memory programming time due to the effects of drive noise from the power supply.

Achieving multilevel storage by accumulating two or more bits of data for each memory cell, requires limiting the threshold voltage distribution width for each piece of data to a small level. However these variations in program characteristics will greatly increase the time required for programming (writing) the memory.

The present embodiment can reduce the variations in programming characteristics that are caused by the auxiliary electrode. A detailed description is related using FIG. 11. At time t0, the data line (91) is first of all set to the program drain voltage of 4 volts, the control electrode (30) (third electrode) is set to the program word voltage of 15 volts (voltage potential E), and the gate electrodes (36) (38) are both set to 8 volts. By simultaneously setting the auxiliary electrode (13) (second electrode) to 8 volts (voltage potential C), the inversion layer (61) (second inversion layer) formed beneath the auxiliary electrode reached 4 volts (voltage potential D). Afterwards, at time t1, the gate electrode (38) deactivates at 0 volts, the connection between the data line (91) and the inversion layer (61) is terminated, and the inversion layer (61) reaches a floating state. At this time, when the inversion layer capacitance is set as Ci, the charge quantity Qi accumulated on the inversion layer (61) reaches Ci×4 coulombs. Afterwards at time t2, when the auxiliary electrode (12) (first electrode) rises to 2 volts which is the program voltage (voltage potential A), the charge quantity Qi accumulated on the inversion layer (61), passes through the substrate surfaces respectively below the memory node (50) and the auxiliary electrode (12) and discharges to the data line (90). The data line reaches 0 volts (voltage potential B) at this time. A state of low resistance is reached at this time, except for the substrate surface below the auxiliary electrode (12) so that when there is a voltage differential between the diffusion layers, an electrical field concentrates below the right terminal of the auxiliary electrode (12) and hot electrons are emitted. The emitted hot electrons are attracted towards the control electrode (30) since the voltage potential is high (voltage potential E) on the control electrode (30) (third electrode). The hot electrons jump the tunnel insulator film (40) potential barrier and are injected into the memory node (50). The substrate surface below the auxiliary electrode (12) is at a high-resistance state at this time so the electrical current flowing between the inversion layer (60) and the data line (90) is not very large, and so the hot electrons can be injected with better efficiency than when there is no auxiliary electrode structure. If programming is not desired then, if the data line (90) is set to approximately 2 volts, or the inversion layer (61) is set to 0 volts, then hot electrons are not emitted and therefore there is no electrical charge injection. Also, if the unselect word line (31) is set to an adequately low voltage (for example 0 volts), and the channel of the memory cell driving the unselect word line is made non-conducting, then no information is programmed (written) After the charge on the inversion layer (61) is sufficiently discharged, the auxiliary electrode (12) is deactivated to 0 volts at time t3 and the programming ends. Next, at time t4, the data line (91) sets to 0 volts, and the gate electrode is again set to 8 volts. Consequently, the data line (91) is connected to the inversion layer (61) and the inversion layer (61) is set to 0 volts. The control electrode (30) is afterwards deactivated to 0 volts at time t5, and the auxiliary electrode (13) is deactivated (lowered) to 0 volts at time t6. Aside from the above described differences in programming operation, two bits of information are stored in the memory node (50) the same as in the first example.

The program operation described above automatically ends at the point in time that the charge accumulated in the inversion layer discharges. The electrical charge quantity Qg injected into the memory node (50) is expressed as $Qg=Qi \times \gamma$ when the injection efficiency is $\gamma$. Here, the injection efficiency $\gamma$, is a function of the memory node (50) voltage potential and drain voltage, and the auxiliary electrode (12) voltage. Though the injection efficiency $\gamma$ fluctuates during the programming operation, here it is assumed to be a fixed value. The injection efficiency $\gamma$ dependence on the voltage of the auxiliary electrode is comparatively small. For example, when the auxiliary electrode voltage fluctuates by ±0.1 volt, the $\gamma$ will only fluctuate by a figure of about 0.3. Since the electrical charge Qd accumulated in the inversion layer is a fixed value, the variations in the Qg that expresses the program characteristics can also be limited to a figure of about 0.3. In contrast to the program method of the first example where a variation of one decimal place or more occurred, a drastic decrease in variations can be achieved in this embodiment and the programming time can be shortened.

The programming operation further renders the following effects. Namely, after accumulating an electrical charge in the inversion layer, programming can be implemented using that charge. The power supply for the program drain can therefore be rendered inert during the actual programming (writing) operation. The auxiliary electrode therefore is not affected by noise from the program drain power supply and stable programming operation is achieved. The charge can also be supplied at a fixed capacity so that the design of the program drain power supply can be kept simple. For example in the method of the related art, the power supply must have a margin for error due to variations that occur so a large current supply capacity is required. However in the present method, no variations occur in the quantity of the charge to be supplied so that the power supply capacity can be kept to a minimum. The size of the power supply circuit can therefore be drastically reduced.

Read and erase operation is performed the same as in the first example.

In the example of the present embodiment, two bits were stored in 4 threshold levels in the memory node (50). Needless to say however, one bit may also be stored. The memory structure in this example, can be fabricated with a small pitch between the auxiliary electrode wiring since there is no diffusion layer wiring formed by impurities (doping) in the memory cell array. The memory cell therefore has a small surface area and the memory can be produced at a low cost. The present embodiment is also capable of high speed programming (write) since dimensional variations in the auxiliary electrode and variations in the applied voltage are drastically reduced.

Second Embodiment

The second embodiment of the present invention is described next while referring to FIG. 7 through FIG. 9, and FIG. 12. The program operation in the present embodiment is different from that of the second example (example 2). In the program operation on the memory cell shown in the second example, the substrate surface below the auxiliary electrode (16) was in a high-resistance conducting state so that the auxiliary electrode (16) (second electrode) was set to a comparatively low voltage potential and operated in the sub-threshold region. Irregularities (variations) in the auxiliary electrode dimensions and variations in the applied voltage therefore greatly effect the program characteristics of the memory cell. For example, if the thickness of the gate oxide film below the auxiliary electrode is 9 nm, then a variation of ±0.1 volts in the auxiliary electrode voltage will cause a change equal to approximately one decimal place in the quantity of electrons injected into the electrical charge accumulation region. Also, the internal power supply for supplying channel current is operating during programming so that the voltage potential of the auxiliary electrode might possible change due to effects of noise from the internal power supply. Since the memory cell program (write) characteristics are greatly affected by the auxiliary electrode voltage as described previously, then even a tiny drive noise from the internal power supply might cause a fluctuation (variation) in characteristics.

During the program sequence, a program bias (voltage) is applied and the threshold value is repeatedly checked until the values of all memory cells simultaneously being programmed have reached the desired value. So if there are variations in the memory cell characteristics, then the number of program bias voltage applications and threshold level checks will increase so that the programming time becomes long. Therefore effects sustained from variations in the auxiliary electrode dimensions or variations in the voltage applied to the auxiliary electrode are likely to greatly lengthen the memory programming time due to the effects of drive noise from the internal power supply.

Achieving multilevel storage by accumulating two or more bits of data for each memory cell, requires limiting the threshold voltage distribution width for each piece of data to a small level. These variations in program characteristics will therefore greatly increase the time required for programming (writing) the memory.

The present embodiment can reduce the variations in programming characteristics caused by the auxiliary electrodes. A detailed description is related using FIG. 12. At time t0, the data line (92) is first of all set to the program drain voltage of 4 volts (voltage potential D), and the control electrode (30) (fifth electrode) is set to the program word voltage of 15 volts (voltage potential F), and the gate electrodes (36) (38) are both set to 8 volts. By simultaneously setting the auxiliary electrode (15) (first electrode) to 3.5 volts (voltage potential A), and setting the auxiliary electrode (17) (fourth electrode) to 8 volts (voltage potential C), an inversion layer is formed beneath the auxiliary electrodes. The inversion layer (62) is set to 0 volts (voltage potential B) and the inversion layer (63) (second inversion layer) reaches 4 volts (voltage potential D) by respectively being supplied with power by the data line (93) and the data line (92). Afterwards, at time t1, the gate electrode (38) deactivates at 0 volts, the connection between the data line (92) and the inversion layer (63) is terminated, and the inversion layer (63) reaches a floating state. At this time, when the inversion layer capacitance is set as Ci, the charge quantity Qi accumulated on the inversion layer (63) reaches Ci×4 coulombs. Afterwards at time t2, when the auxiliary electrode (16) (second electrode) rises to 2 volts which is the program voltage (voltage potential E), the charge Qi accumulated on the inversion layer (63), passes through the substrate surfaces respectively below the memory node (53) and the auxiliary electrode (16), and the memory node (54) and discharges to the inversion layer (62). A state of low resistance is reached at this time, except for the substrate surface below the auxiliary electrode (16) so that when there is a voltage differential between the diffusion layers (62) (63), an electrical field concentrates below the right terminal of the auxiliary electrode (16) and hot electrons are emitted. These emitted hot electrons are attracted towards the control electrode (30) since the voltage potential is high on the control electrode (30) (third electrode). The hot electrons jump the tunnel insulator film (40) potential barrier and are injected into the memory node (53). The substrate surface below the auxiliary electrode (16) is at a high-resistance state at this time so the electrical current flowing between the diffusion layers (81) (83) is not very large, the hot electrons are injected with higher efficiency than the case where there is no auxiliary electrode structure.

When programming is not wanted then, if the inversion layer (62) is set to approximately 2 volts, or if the inversion layer (63) is set to 0 volts, then hot electrons are not emitted, and therefore no charge injection occurs because there is no difference in the voltage potential between the inversion layers (62) (63). Also, if the unselect word line (31) is set to an adequately low voltage (for example 0 volts), and the memory cell channel driving the unselect word line are made non-conducting, then no information is programmed (written). Aside from the above described differences in program operation, two bits of information are stored in the memory node the same as in the first embodiment.

This programming operation described above automatically ends at the point in time that the charge accumulated in the inversion layer discharges. The electrical charge quantity Qg injected into the electrical charge accumulator region (53) is expressed as Qg=Qi×γ when the injection efficiency is γ. Here, the injection efficiency γ, is a function of the electrical charge accumulator region (53) voltage potential and drain voltage, and the auxiliary electrode (16) voltage. Though the injection efficiency γ fluctuates during the programming operation, here it is assumed to be a fixed value. The injection efficiency γ dependence on the voltage of the auxiliary electrode is comparatively small. For example, when the auxiliary electrode voltage fluctuates by ±0.1 volt, the γ will only fluctuate by a figure of about 0.3. Since the electrical charge Qi accumulated in the inversion layer is a fixed value, the variations in the Qg that expresses the program characteristics can also be limited to a figure of about 0.3. In contrast to the program method of the first embodiment, where a variation of one decimal place or more occurred, a drastic decrease in programming variations can be achieved in this embodiment and the programming time can be shortened.

The programming operation further renders the following effects. Namely, after accumulating an electrical charge in the inversion layer, programming can be implemented using that charge. The power supply for program drain can therefore be rendered inert during the actual program writing operation. The auxiliary electrode therefore is not affected by noise from the power supply for the program drain and stable programming operation is achieved. The charge can also be supplied at a fixed capacity so that the design of the program drain power supply can be kept simple. For example in the method of the related art, the power supply must have a margin for error due to variations that occur, so a large current supply capacity is required. However in the present method, no variations occur in the quantity of the electrical charge to be supplied so that the power supply capacity can be kept to a minimum. The size of the power supply circuit can therefore be drastically reduced.

Read and erase operation is performed the same as in the second example. In this example of the present embodiment, two bits were stored in 4 threshold levels in the memory node (53). Needless to say however, one bit may also be stored. The memory structure in this example, can be fabricated with a small pitch between the auxiliary electrode wiring since there is no diffusion layer wiring formed by impurities (doping) in the memory cell array. The memory cell therefore has a small surface area and the memory can be produced at a low cost. The present embodiment is also capable of high speed programming (writing) since the source side inversion layer has low resistance because programming variations due to dependence on the distance from the contact of the memory cell are drastically reduced.

Third Embodiment

The third embodiment of the present invention is described next while referring to FIG. 1 through FIG. 3, and FIG. 13. The program operation in the present embodiment is different from that of the first embodiment.

In the programming method of the memory cell shown in the first embodiment, a strong voltage (for example 8 volts) is applied to the oxidized film between the auxiliary electrode (13) (second electrode) and the inversion layer (61) (second inversion layer) at the end of programming, so deterioration of the oxidized film is a serious concern. This deterioration causes shorts between the gate and substrate, and fluctuations in the threshold values, and may cause a large loss of reliability. Generally, the higher the voltage applied to the oxidized film, the faster the deterioration. Also, the longer the voltage is applied, the faster the deterioration. Measures to control deterioration of the oxide film include thickening the oxide film to weaken the electrical field or lowering the voltage applied to the auxiliary electrode. If the oxide film has been thickened, the voltage applied to the auxiliary electrode must be raised even higher in order to conduct the programming drain voltage (for example 4 volts) through the inversion layer wiring layer. Consequently, the electrical field cannot be weakened and the deterioration of the oxide film cannot be suppressed. On the other hand, when the voltage applied to the auxiliary electrode is lowered, the programming drain voltage cannot conduct easily through the inversion layer, and brings about a drastic drop in programming (writing) speed, so this is not a desirable method to employ.

The present embodiment utilizes a programming method that achieves both a fast programming speed and suppresses deterioration of the oxide film. This method is described next in detail while referring to FIG. 13. First of all, at time t0, the data line (91) is set to 4 volts (voltage potential D) which is the programming drain voltage, and the control electrode (30) (third electrode) is set to a programming word voltage of 15 volts (voltage potential E), and the gate electrodes (36) (38) are both set to 8 volts. The inversion layer (61) (second inversion layer) beneath the auxiliary electrode is made to reach 4 volts (voltage potential D) by setting the auxiliary electrode (13) (second electrode) to 8 volts (voltage potential C) at the same time. Afterwards, at time t1, the gate electrode (38) is lowered (deactivated) to 2 volts, the connection between the data line (91) and the inversion layer (61) is terminated, and the inversion layer (61) (second inversion layer) sets to a floating state. At this time, when the inversion layer capacitance is set as Ci, the charge quantity Qi accumulated on the inversion layer (61) reaches Ci×4 coulombs. Afterwards at time t2, when the auxiliary electrode (12) (first electrode) rises to 2 volts which is the program voltage (voltage potential A), the charge Qi accumulated on the inversion layer (61), passes through the substrate surfaces respectively below the memory node (50) and the auxiliary electrode (12) and discharges to the data line (90). The data line in this case reaches 0 volts (voltage potential B). A state of low resistance is reached at this time, except for the substrate surface below the auxiliary electrode (12) so that when there is a voltage differential between the diffusion layers, an electrical field concentrates below the right terminal of the auxiliary electrode (12) and hot electrons are emitted. The emitted hot electrons are attracted towards the control electrode (30) since the voltage potential is high on the control electrode (30) (third electrode). The hot electrons jump the tunnel insulator film (40) potential barrier and are injected into the memory node (50). The substrate surface below the auxiliary electrode (12) is at a high-resistance state at this time so the electrical current flowing between the inversion layer (61) and the data line (90) is not very large, and so the hot electrons can be injected with better efficiency than when there is no auxiliary electrode structure. If no programming is desired then, if the data line (90) is set to approximately 2 volts, or if the inversion layer (61) is set to 0 volts, then hot electrons are not emitted and therefore there is no electrical charge injection. Also, if the unselect word line (31) is set (clamped) to an adequately low voltage (for example 0 volts), and the channel of the memory cell driving the unselect word line is made non-conducting, then no information is programmed (written). Aside from the above described differences in programming operation, two bits of information are stored in the memory node (50) the same as in the first example.

In this programming (write) operation, two volts are applied to the gate electrode (38) from the time t1 onwards so that the voltage potential on the channel of the selected transistor exceeds one volt and reaches the cut-off state. Consequently during discharge of the charge accumulated in the inversion layer (61), a charge is continually supplied from the data line (91) by selecting a transistor so that the voltage potential on the inversion layer (61) reaches approximately one volt. At the end of the programming operation, a comparatively small voltage (for example 7 volts) will flow in the oxide film between the auxiliary electrode (13) and the inversion layer (61) for the above reasons so that deterioration of the oxide film can be suppressed.

In this programming method, the programming (write) automatically ends simultaneously with the voltage potential on the inversion layer (61) dropping below approximately two volts. Programming ends because when the programming drain voltage has fallen below approximately two volts, the electrical field is not concentrated enough for hot electrons to be sufficiently emitted at the boundary between the inversion layer (60) below the auxiliary electrode (12), and the inversion layer below the control electrode (30). Therefore, even if one volt is supplied to the inversion layer (61), there is no programming because there is not a sufficient injection of hot electrons. Needless to say, a drastic decrease in programming variations can be achieved in this embodiment for the same reasons as in the first embodiment, and the programming time can be shortened.

The above described programming method can be applied to the second embodiment. Also programming variations due to distance dependence can be reduced, and programming variations can be suppressed. Read and erase operations can be performed the same as in the first example.

In the example of the present embodiment, two bits were stored at 4 threshold levels in the memory node (50). Needless to say however, one bit may also be stored. The memory structure in this embodiment, can be fabricated with a small pitch between the auxiliary electrode wiring since there is no diffusion layer wiring formed by impurities (doping) in the memory cell array. The memory cell therefore has a small surface area and the memory can be produced at a low cost. The present embodiment is also capable of high speed programming (writing) since variations in the auxiliary electrode dimensions, and variations in the applied voltage have been drastically reduced. Moreover, at the end of the programming operation, the electrical field applied to the oxide film between the auxiliary electrode and the inversion layer becomes small, so that deterioration of the oxide film can be suppressed, and reliability can be improved.

Fourth Embodiment

The fourth embodiment of the present invention is described next while referring to FIG. 7 through FIG. 9, and FIG. 14. The program operation in the present embodiment is different from that of the second embodiment.

In the programming method of the memory cell shown in the second embodiment, a strong voltage (for example 8 volts) is applied to the oxidized film between the auxiliary electrode (17) (fourth electrode) and the inversion layer (63) (second inversion layer) at the end of programming, so deterioration of the oxidized film is a serious concern. This deterioration causes shorts between the gate and substrate, and fluctuations in the threshold values, and may cause a large loss of reliability. Generally, the higher the voltage applied to the oxidized film, the faster the deterioration. Also, the longer the voltage is applied, the faster the deterioration. Measures to control deterioration of the oxide film include thickening the oxide film to weaken the electrical field or lowering the voltage applied to the auxiliary electrode. If the oxide film has been thickened, the voltage applied to the auxiliary electrode must be raised even higher in order to conduct the programming drain voltage (for example 4 volts) through the inversion layer wiring layer. Consequently, the electrical field cannot be weakened and the deterioration of the oxide film cannot be suppressed. On the other hand, when the voltage applied to the auxiliary electrode is lowered, the programming drain voltage cannot conduct easily through the inversion layer, and brings about a drastic drop in programming (writing) speed, so this is not a desirable method to employ.

The present embodiment utilizes a programming method that achieves both a fast programming speed and suppresses deterioration of the oxide film. This method is described next in detail while referring to FIG. 14A. First of all, at time t0, the data line (92) is set to 4 volts (voltage potential D) which is the programming drain voltage, and the control electrode (30) (fifth electrode) is set to a programming word voltage of 15 volts (voltage potential F), and the gate electrodes (36) (38) are both set to 8 volts. Moreover, the inversion layer (63) (second inversion layer) beneath the auxiliary electrode is made to reach 4 volts (voltage potential C), and the inversion layer (62) to zero volts (voltage potential B) by setting the auxiliary electrode (15) (first electrode) to 4 volts (voltage potential A) and the auxiliary electrode (17) (fourth electrode) to eight volts (voltage potential C) at the same time. Afterwards, at time t1, the gate electrode (38) is lowered (deactivated) to 0 volts, the connection between the data line (92) and the inversion layer (63) is terminated, and the inversion layer (63) (second inversion layer) sets to a floating state. Unlike the second embodiment, the gate electrode (36) lowers (deactivates) to zero volts at this same time. The connection between the data line (93) and the inversion layer (62) is therefore terminated and the inversion layer (62) sets to a floating state. Consequently, a capacitor having an inversion layer capacitance of Ci is formed from the inversion layer (62) and the auxiliary electrode (15), while an electrical charge consisting of an electrical charge quantity Qi (Ci×4) coulombs is accumulated in the inversion layer (63). Afterwards at time t2, when the auxiliary electrode (16) (second electrode) rises to 2 volts (voltage potential E) which is the program voltage, the charge Qi accumulated on the inversion layer (63), passes through the substrate surfaces respectively below the memory node (53) and the auxiliary electrode (16) and discharges to the capacitor formed from the inversion layer (62) and the auxiliary electrode (15). A state of low resistance is reached at this time, except for the substrate surface below the auxiliary electrode (16) so that when there is a voltage differential between the diffusion layers, an electrical field concentrates below the right terminal of the auxiliary electrode (16) and hot electrons are emitted. The emitted hot electrons are attracted towards the control electrode (30) since the voltage potential is high on the control electrode (30) (third electrode). The hot electrons jump the tunnel insulator film (40) potential barrier and are injected into the memory node (53). The substrate surface below the auxiliary electrode (16) is at a high-resistance state at this time so the electrical current flowing between the inversion layer (63) and the inversion layer (62) is not very large, and hot electrons can be injected with higher efficiency than the case where there is no auxiliary electrode structure. If no programming is wanted, then, if the data line (93) is set to approximately two volts, or if the inversion layer (63) is set to zero volts, then hot electrons are not emitted and therefore there is no electrical charge injection. Also, if the unselect word line (31) is set (clamped) to an adequately low voltage (for example 0 volts), and the channel of the memory cell driving the unselect word line is made non-conducting, then no information is programmed (written). Aside from the above described differences in programming operation, two bits of information are stored in the memory node (50) the same as in the first example.

In the above programming method, the charges accumulated in the inversion layer (63) are discharged to the inversion layer (62) so the voltage potential of the inversion layer (62) rises, a cutoff state is reached below the auxiliary electrode (16), and the programming (writing) automatically ends at the point in time that the connection between the inversion layer (62) and channel below the memory node (53) is terminated. The voltage potential of the inversion layer (62) whose connection was terminated is a function of the auxiliary electrode (16), however in this voltage setting, the connection is terminated when the voltage potential of inversion layer (62) is approximately one volt. The voltage between the inversion layer (63) and the auxiliary electrode (17) therefore reaches approximately five volts when programming ends, so that this embodiment drastically reduces deterioration of the oxidized film to a greater extent than the third embodiment. Needless to say, a drastic decrease in programming variations can be achieved in this embodiment for the same reasons as in the second embodiment, and the programming time can be shortened. However, in this programming method, the electrical charge quantity applied to programming is lower so the programming speed drops.

In the above programming method, the electrical charge accumulated in the inversion layer (63) capacitance was utilized. However charges accumulated in the data line (92) and the inversion layer (63) can also be utilized for programming. In that case, the data line (92) is set to four volts, and after raising (activating) the inversion layer (63) to four volts, the data line (92) is set to the floating state without lowering (deactivating) the gate electrode (38). If the data line capacity is set as Ca, then the accumulated charge Qa becomes (Ci+Ca)×4. During programming, the (accumulated) charge is discharged to the inversion layer (62) and the data line (93), and the programming automatically ends at the point in time that the connection between the channel beneath the memory node (53) and the inversion layer (62) is terminated. In this programming method, a larger electrical charge can be accumulated compared to the case when only accumulating a charge in the inversion layer. Moreover, a larger number of electrons can be injected into the floating gate in one injection. The read and erase operation is the same as in the first example (example 1).

In the example of the present embodiment, two bits were stored at 4 threshold levels in the memory node (53). Needless to say however, one bit may also be stored. The memory structure in this example, can be fabricated with a small pitch between the auxiliary electrode wiring since there is no diffusion layer wiring formed by impurities (doping) in the memory cell array. The memory cell therefore has a small surface area and the memory can be produced at a low cost. The programming operation of the present embodiment can drastically reduce variations in programming that arise due to dependence on the distance from the contact of the memory cell, because the source side inversion layer has a low resistance. Moreover, high speed programming (writing) can be achieved since variations in the dimensions of the auxiliary electrode, and variations in the applied voltage are drastically reduced. Moreover, at the end of the programming operation, the electrical field applied to the oxide film between the auxiliary electrode and the inversion layer becomes small, so that deterioration of the oxide film can be suppressed, and reliability can be improved.

Fifth Embodiment

The fifth embodiment of the present invention is described next while referring to FIG. 1 through FIG. 3, and FIG. 15. The program operation in the present embodiment is different from that of the first embodiment.

In the programming method of the memory cell shown in the first embodiment, a strong voltage (for example 8 volts) is applied to the oxidized film between the auxiliary electrode (13) (second electrode) and the inversion layer (61) (second inversion layer) at the end of programming, so deterioration of the oxidized film is a serious concern. This deterioration causes shorts between the gate and substrate, and fluctuations in the threshold values, and may cause a large loss of reliability. Generally, the higher the voltage applied to the oxidized film, the faster the deterioration. Also, the longer the voltage is applied, the faster the deterioration. Measures to control deterioration of the oxide film include thickening the oxide film to weaken the electrical field or lowering the voltage applied to the auxiliary electrode. If the oxide film has been thickened, then the voltage applied to the auxiliary electrode must be raised even higher in order to conduct the programming drain voltage (for example 4 volts) through the inversion layer wiring layer. Consequently, the electrical field cannot be weakened and deterioration of the oxide film cannot be suppressed. On the other hand, when the voltage applied to the auxiliary electrode is lowered, the programming drain voltage cannot conduct easily through the inversion layer, and brings about a drastic drop in programming (writing) speed, so this is not a desirable method to employ.

The present embodiment utilizes a programming method that achieves both a fast programming speed and suppresses deterioration of the oxide film. This method is described next in detail while referring to FIG. 15. First of all, at time t0, the data line (91) is set to 4 volts (voltage potential D) which is the programming drain voltage, and the control electrode (30) (third electrode) is set to a programming word voltage of 15 volts (voltage potential E), and the gate electrodes (36) (38) are both set to 8 volts. Moreover, the inversion layer (61) (second inversion layer) beneath the auxiliary electrode is made to reach 4 volts (voltage potential D), by simultaneously setting the auxiliary electrode (13) (second electrode) to 8 volts (voltage potential C). Next, unlike in the first embodiment, the gate electrode (38) is not lowered (deactivated) to zero volts. After the data line (90) is set to zero volts (voltage potential B), a floating state is set. The data line (90) therefore forms a capacitor for the capacitance Ca. Then at time t1, when the auxiliary electrode (12) (first electrode) is raised to two volts (voltage potential A) which is the programming voltage, an electrical current flows in the substrate surfaces respectively below the inversion layer (61) from data line (91) the memory node (50), and the auxiliary electrode (12) and charges the data line (90). A state of low resistance is reached at this time, except for the substrate surface below the auxiliary electrode (12)

so that when there is a voltage differential between the diffusion layers, an electrical field concentrates below the right terminal of the auxiliary electrode (12) and hot electrons are emitted. The emitted hot electrons are attracted towards the control electrode (30) since the voltage potential is high on the control electrode (30). The hot electrons jump the tunnel insulator film (40) potential barrier and are injected into the memory node (50). The substrate surface below the auxiliary electrode (12) is at a high-resistance state at this time so the electrical current flowing between the inversion layer (61) and the data line (90) is not very large, and hot electrons can be injected with higher efficiency than the case where there is no auxiliary electrode structure.

When programming is not wanted then, if data line (90) is set to approximately 2 volts, or if the inversion layer (61) is set to 0 volts, then no hot electrons are emitted and consequently charge injection is not performed. Also, if the unselect word line (31) is set to an adequately low voltage (for example 0 volts), and the memory cell channel driving the unselect word line are made non-conducting, then no information is programmed (written). Aside from the above described differences in program operation, two bits of information are stored in the memory node (50) the same as in the first example.

In this programming method, the voltage potential of the inversion layer (61) is maintained at four volts so only an extremely small voltage of approximately four volts is applied to the oxide film between the auxiliary electrode (13) and the inversion layer (61) so deterioration in the oxide film can be drastically reduced.

In this programming method, the connection between the inversion layer (61) and data line (90) is terminated simultaneously with the voltage potential on the inversion layer (60) rising above approximately one volt, and the programming automatically ends. Consequently, the capacitance Ca of the data line (90) and the capacitance Ci of the inversion layer (60) contribute an electrical charge of only about one volt to precharging for programming (writing). The variations in programming can therefore be drastically reduced for the same reasons as described for the first embodiment so that needless to say, the programming time can be shortened.

This programming method can be applied to the second embodiment. As clearly shown in the fourth embodiment, the capacitance of the inversion layer (62), or the capacitance of the data line (93) can be used for the capacitance at the precharge destination. In this case, the inversion layer on the source side is at a low-resistance state so programming variations due to dependence on the distance from the contact of the memory cell can be drastically reduced, and high speed programming attained.

The read and erase operation is the same as in the first example (example 1).

In the example of the present embodiment, two bits were stored at 4 threshold levels in the memory node (50). Needless to say however, one bit may also be stored. The memory structure in this example, can be fabricated with a small pitch between the auxiliary electrode wiring since there is no diffusion layer wiring formed by impurities (doping) in the memory cell array. The memory cell therefore has a small surface area and the memory can be produced at a low cost. Moreover, high speed programming (writing) can be achieved since variations in programming due to variations in the dimensions of the auxiliary electrode, and variations in the applied voltage are drastically reduced. Moreover, at the end of the programming (writing) operation, the electrical field applied to the oxide film between the auxiliary electrode and the inversion layer becomes small, so that deterioration of the oxide film can be suppressed, and reliability can be improved.

Sixth Embodiment

The sixth embodiment of the present invention is described next while referring to FIG. 1 through FIG. 3, and FIG. 15 and FIG. 17. The program operation in the present embodiment is different from that of the first embodiment.

In the first example, four volts can be applied to the inversion layer (61) by applying a comparatively large voltage (for example 8 volts) to the auxiliary electrode (13).

In the present embodiment, a comparatively small voltage is applied to the auxiliary electrode (13) (second electrode) so that four volts can be applied to the inversion layer (61). Consequently, the chip surface area (size) can be reduced as described next, by utilizing a low voltage as the power supply for driving the auxiliary electrode.

Figure 16:
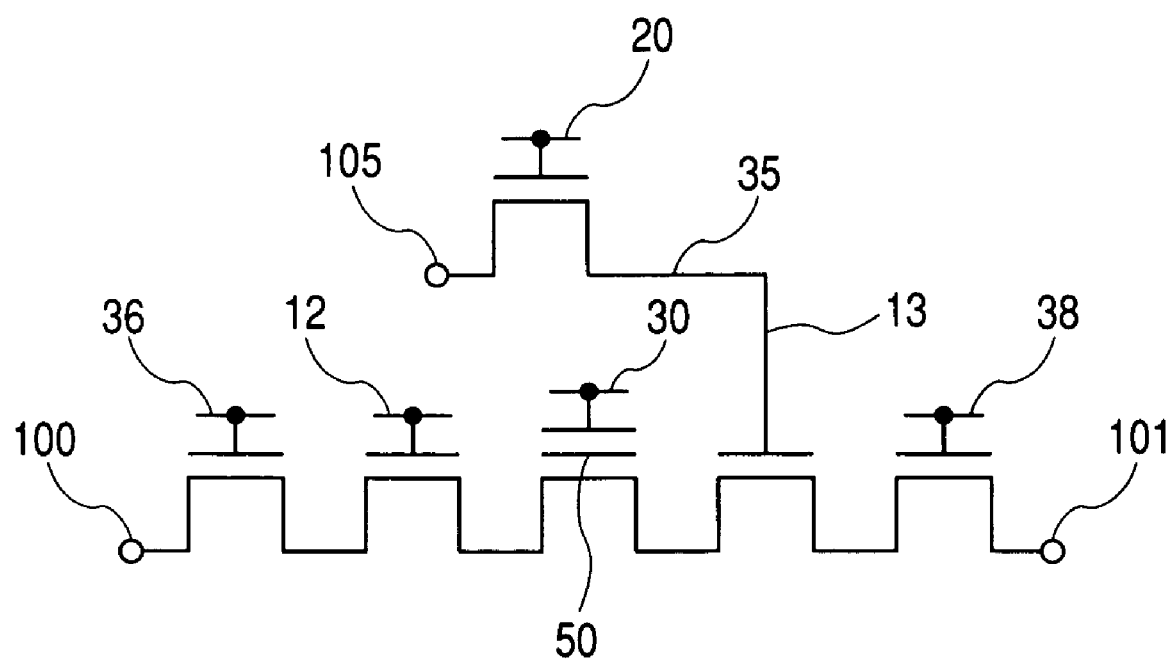
FIG. 16 is a circuit diagram along the programming electrical current path of the sixth embodiment of the present invention.
Figure 17:
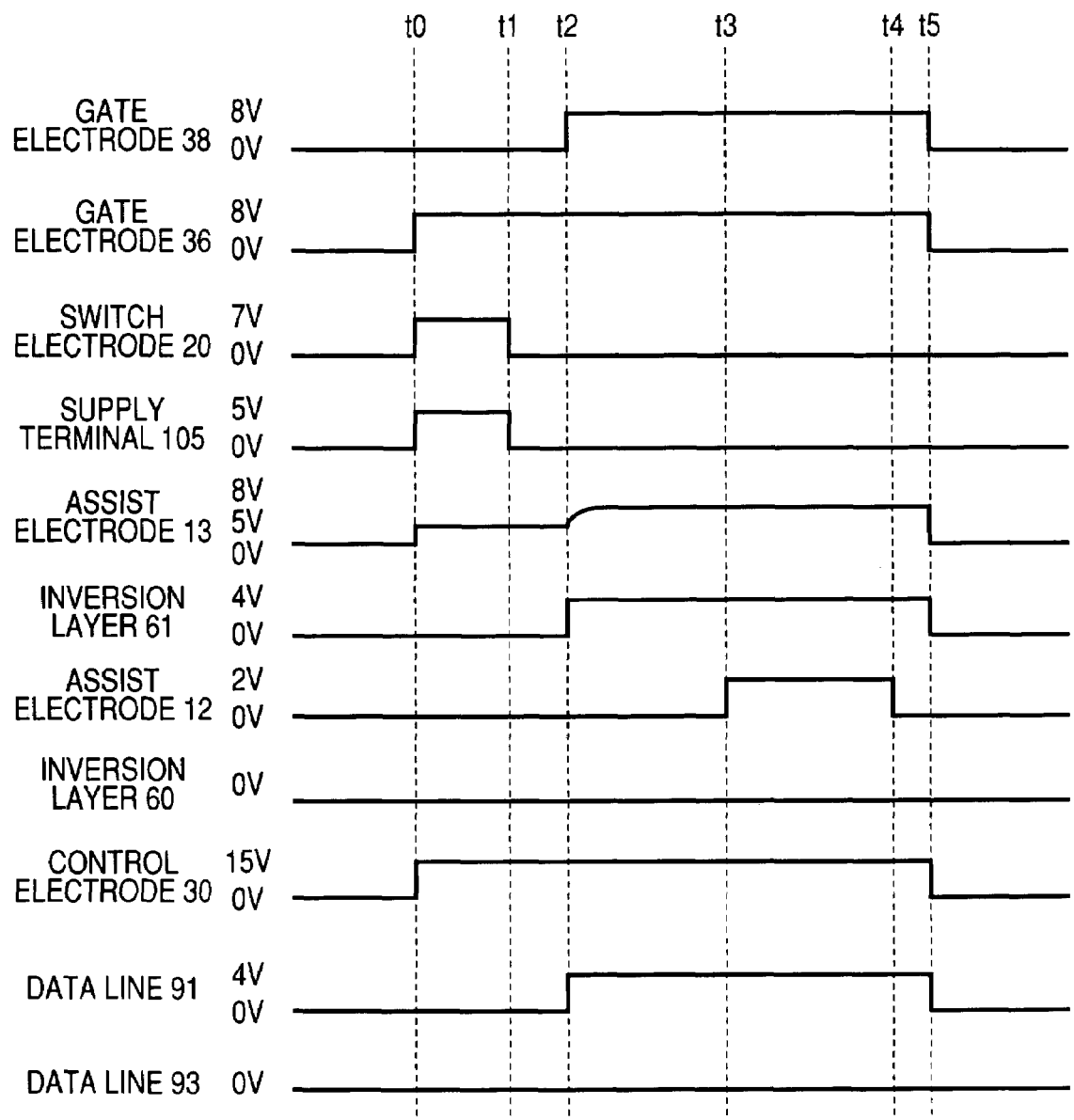
FIG. 17 is a timing diagram for describing the programming operation of the sixth embodiment of the present invention.

As shown in FIG. 16, when a voltage is applied to the auxiliary electrode (13) (second electrode), the voltage is applied by way of a driver MOS made from a power supply terminal (105), and a switch electrode (20). The waveform during the programming operation is shown in FIG. 17. At time t0, the switch electrode (20) is raised (activated) to seven volts, and the power supply terminal (105) is raised to five volts. The auxiliary electrode (13) is consequently set to five volts. At the same time, the control electrode (30) is raised to a programming word voltage (for example 15 volts {voltage potential E}), and the gate electrode (36) is raised to eight volts, and the data line (90) clamped to zero volts. Next, at time t1, when the switch electrode (20) and the power supply terminal (105) are lowered (deactivated) to zero volts, the connection between the auxiliary electrode (13) (second electrode) and the power supply terminal (105) is terminated, and a floating state is set while the voltage potential is maintained at five volts (voltage potential C). Next at time t2, the gate electrode (38) is set to eight volts and the data line (91) is raised to four volts (voltage potential D). Consequently, while the inversion layer (61) (second inversion layer) is raised to four volts, the auxiliary electrode (13) is raised to eight volts by coupling between the inversion layer (61) and the auxiliary electrode (13). The programming operation from here onwards is the same as the procedure in the first example (example 1). The voltage potential A and the voltage potential B and so on, are set the same as in the first example.

The above operation allows a low voltage to be used in the power supply driving the auxiliary electrode (13). The surface area (size) taken up by the power supply can therefore be reduced, also allowing the chip surface area to be decreased and costs to be further lowered.

The operating method of the present embodiment can also be applied to the second embodiment and the fifth embodiment, and the same effects as in these embodiments can be obtained.

The memory structure in this embodiment, can be fabricated with a small pitch between the auxiliary electrode wiring since there is no diffusion layer wiring formed by impurities (doping) in the memory cell array. Moreover, the power supply for driving the auxiliary electrode can operate at a low voltage so a low cost memory can be achieved.

Seventh Embodiment

The seventh embodiment of the present invention is described next while referring to FIG. 1 through FIG. 3, and FIG. 18. The programming operation in the present embodiment is different from that of the first embodiment.

In the first embodiment, four volts was supplied from the data line (91) to the inversion layer (13) as the programming drain voltage. However, utilizing the present embodiment allows eliminating the power supply that supplies a programming drain voltage (for example four volts), and the chip surface area (size) can be drastically reduced.

Figure 18:
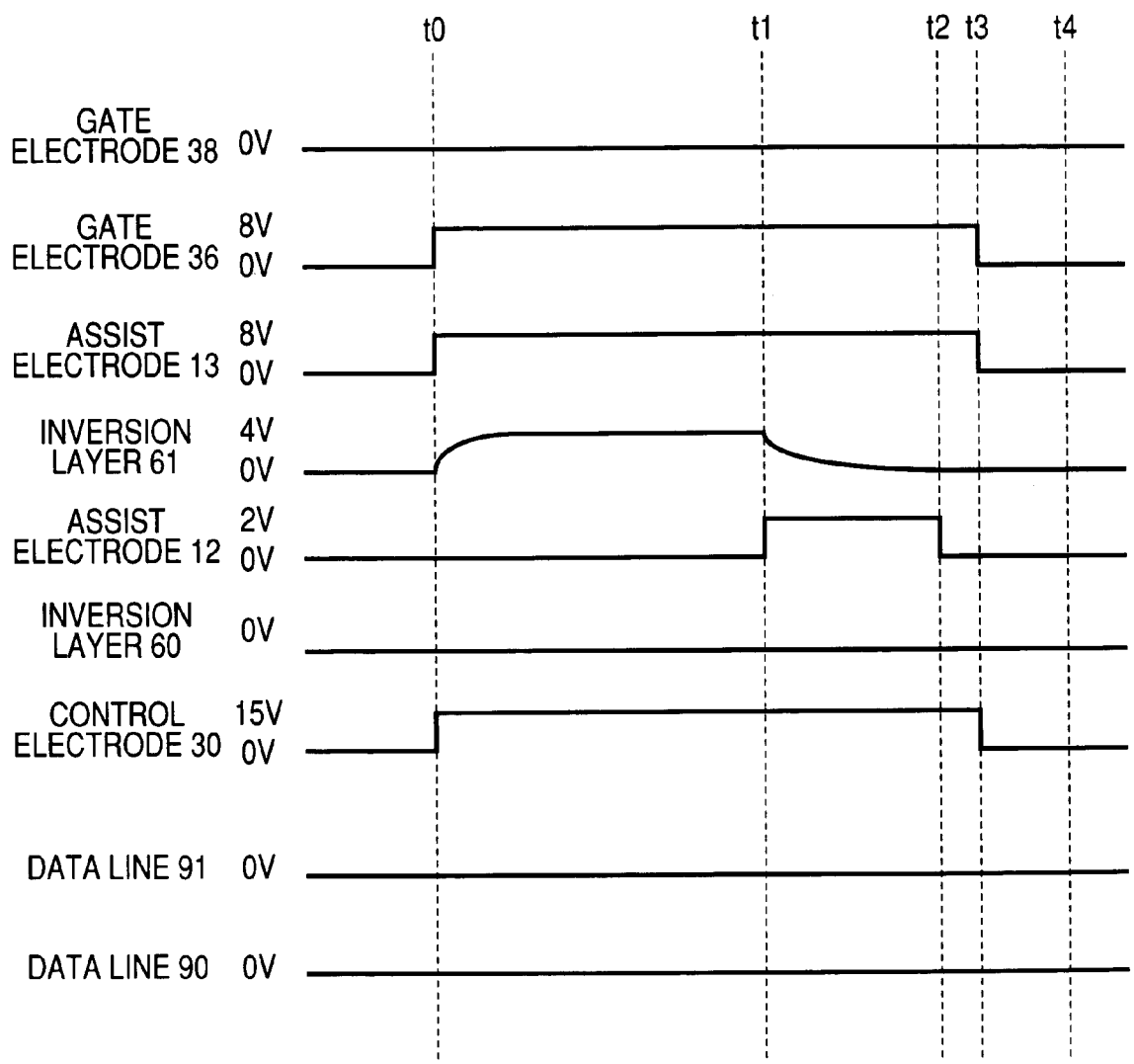
FIG. 18 is a timing diagram for describing the programming operation of the seventh embodiment of the present invention.

The operating waveform of the present embodiment is shown in detail while referring to FIG. 18. At time t0, the control electrode (30) is raised to a programming word voltage (for example 15 volts {voltage potential E}) and the gate electrode (36) is raised to eight volts. The auxiliary electrode (13) (second electrode) raised to eight volts (voltage potential C) at the same time, however unlike in the first embodiment, the gate electrode (38) and the data line (91) are not activated. The substrate surface below the auxiliary electrode (13) therefore sets to a floating state, and when the auxiliary electrode (13) activates, the voltage potential on the substrate surface is raised by coupling between the auxiliary electrode and the substrate surface. An inversion layer (61) (second inversion layer) is consequently formed on the substrate surface and the voltage potential of the inversion layer (61) is set to four volts (voltage potential D). The accumulated electrical charge is written on the coupled inversion layer (61). The programming operation from here onwards is the same as the procedure in the first embodiment. The voltage potential A and the voltage potential B and so on, are set the same as in the first example.

The above operation allows eliminating the power supply used for supplying the programming drain voltage (for example four volts). The space (surface area) occupied by the power supply is therefore not needed and contributes to lowering the chip size (surface area) and allows further lowering of the cost. The operating method of the present embodiment can also be applied to the second embodiment, the third embodiment and the fourth embodiment, and the same effects as in these embodiments can be obtained.

The memory structure in this embodiment, can be fabricated with a small pitch between the auxiliary electrode wiring since there is no diffusion layer wiring formed by impurities (doping) in the memory cell array. Moreover, the power supply for supplying a programming drain power supply can be eliminated, and a low cost memory achieved.

Eighth Embodiment

Figure 19:
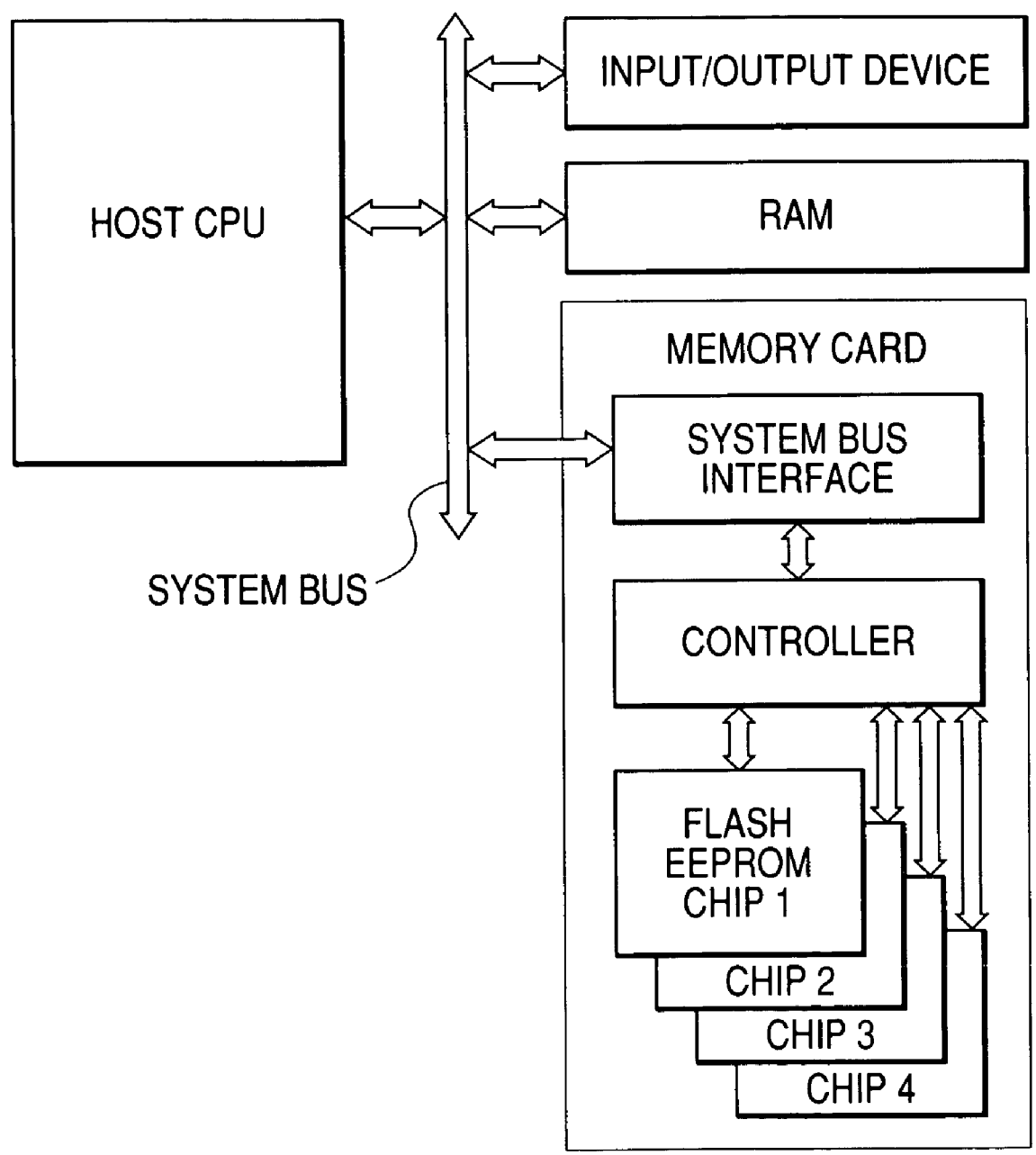
FIG. 19 is a block diagram showing the system structure of the eight embodiment of the present invention.

FIG. 19 is a block diagram showing an example of a computer system including the flash nonvolatile memory of the first through the sixth embodiments of the present invention. This system is comprised of a host CPU, input/output device, RAM and memory card mutually connected by a system bus.

The memory card may for example include a flash nonvolatile memory with large capacity storage of several dozen gigabytes as a substitute for hard disk storage applications. The memory card bestows the high speed programming which is the merit of the nonvolatile memory of the embodiments of the present invention and therefore the memory device representing the final product contains ample advantages in terms of industrial applications.

The present invention is not limited to relatively thin (or low profile) memory cards, even if the memory card is relatively thick, and needless to say is also applicable to nonvolatile memory devices including intelligent controllers capable of analyzing the interface of the host bus system and host system commands, and controlling the flash nonvolatile memory.

While data for long-term storage is stored in this nonvolatile memory device, data frequently changed by CPU processing is stored in a RAM in the volatile memory. The card contains a system bus interface for connecting to a system bus, and capable for example of serving as a standard bus interface such as for the ATA system bus. The controller connected to the system bus interface, receives commands and data from the host system of the input/output device or CPU or host connected to the system bus.

When the command received is a read command, the controller accesses one or multiple flash EEPROM devices as needed, and sends the read data to the host system.

When the command received is a write command, the controller accesses one or multiple flash EEPROM devices as needed, and stores the programming data from the host system inside the EEPROM. This storage operation includes verify and program operations required for the blocks and sectors and memory cells of the flash memory.

When the command received is an erasure command, the controller accesses one or multiple flash EEPROM devices as needed, and erases data stored in the EEPROM. This erasure operation includes erase and verify operations required for the blocks and sectors and memory cells of the flash memory.

The nonvolatile flash memory of the embodiment of the present invention is-not only applicable to technology for storing one bit of digital data in one memory cell at two threshold voltages in the memory cell but is also applicable to technology for storing many bits of digital data in one memory cell at multilevel threshold voltages of four values or more in a memory cell.

Ninth Embodiment

The ninth embodiment of the present invention is described next while referring to FIG. 20 through FIG. 22. The programming operation of the present embodiment is different from that of the first embodiment.

In the programming operation shown in the first embodiment, the electrical charge quantity Qi accumulated in the inversion layer was a fixed value so that programming (writing.) variations were decreased in the simultaneous programming among the multiple memory cells. In the programming operation of the present embodiment, the injection efficiency γ is fixed as well as the electrical charge quantity Qi, so that programming variations are decreased even further. The memory cell programming (write) time is therefore drastically decreased.

Figure 20:
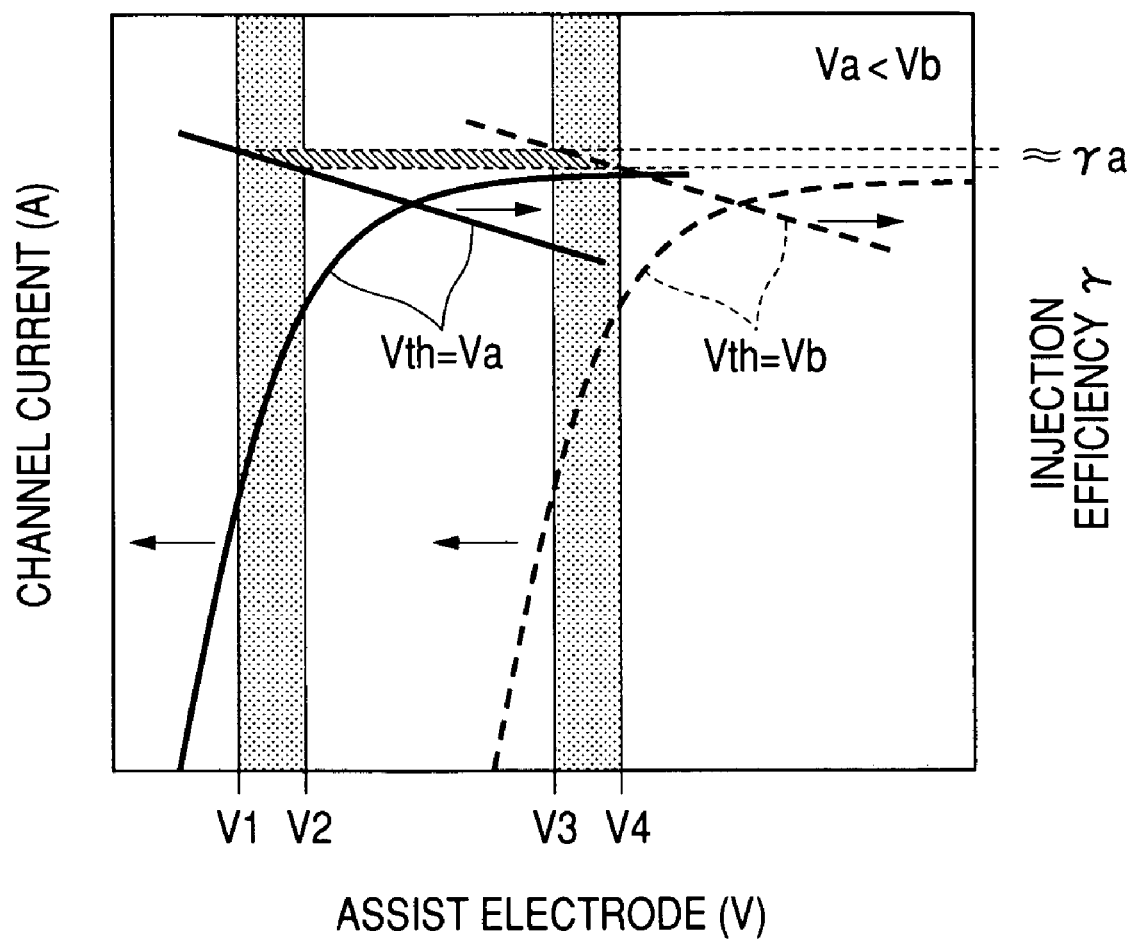
FIG. 20 is a graph showing the current flow and the injection efficiency curve for describing the programming operation of the ninth embodiment of the present invention.
Figure 21:
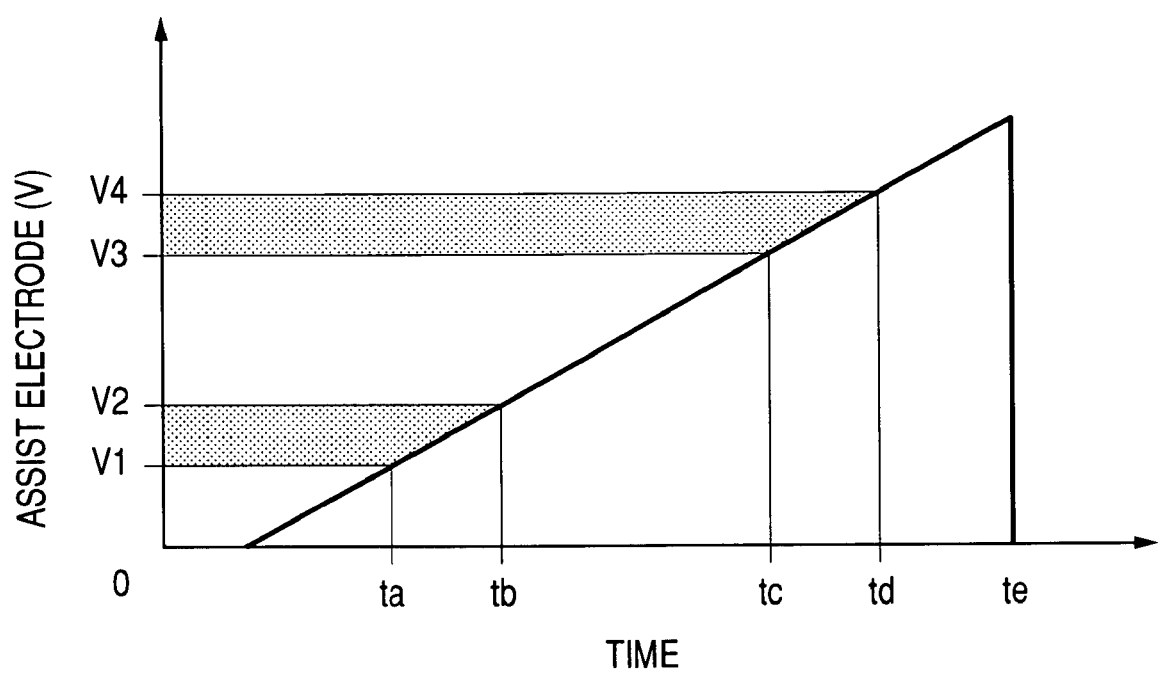
FIG. 21 is a graph for describing the interrelation of time and the auxiliary electrode voltage during programming in the ninth embodiment of the present invention.
Figure 22:
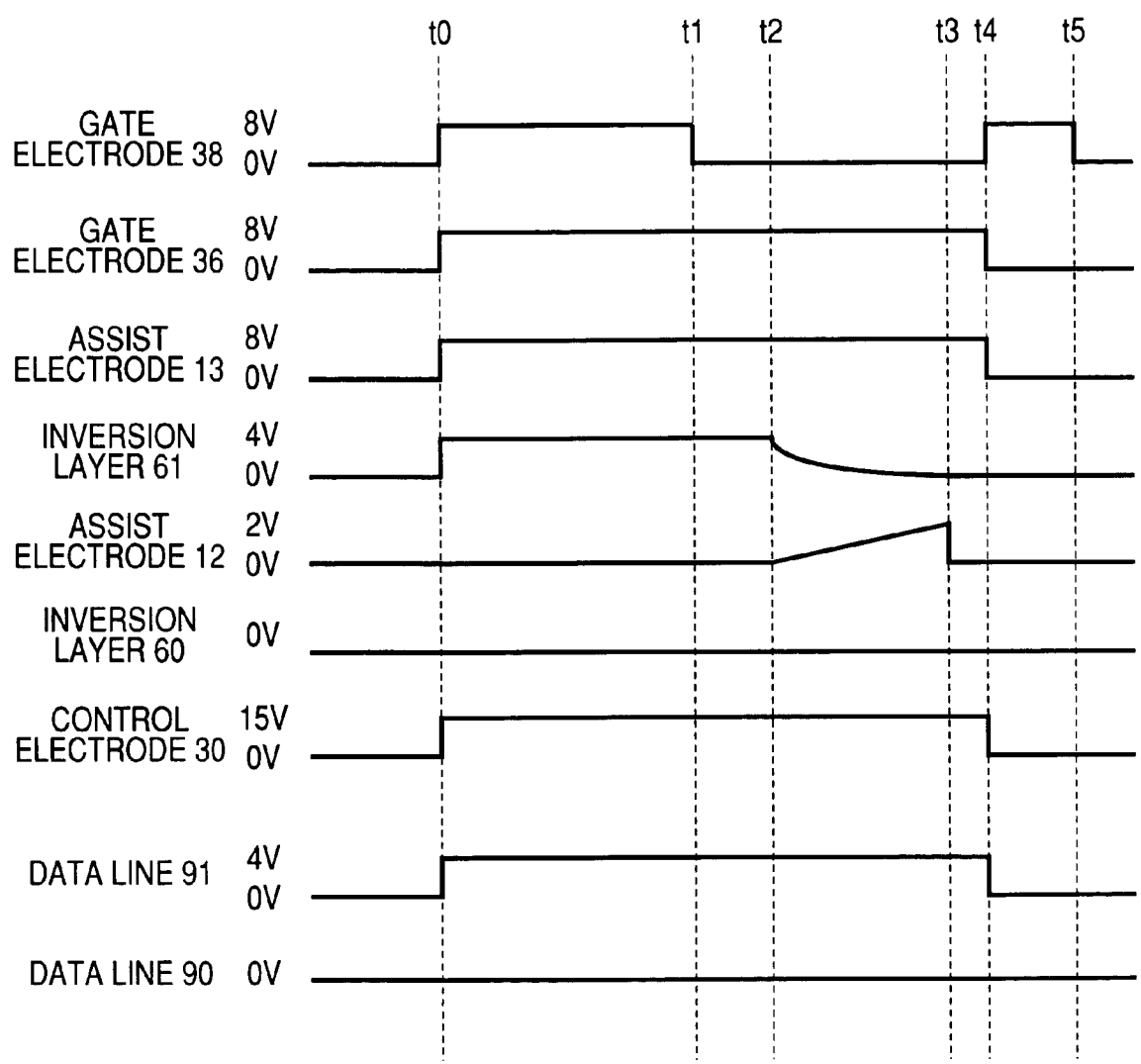
FIG. 22 is a timing chart for describing the programming operation in the ninth embodiment of the present invention.

Variations occurring in the injection efficiency γ in the programming operation of the first embodiment, and the ability of the present invention to fix the injection efficiency γ are described while referring to FIG. 20 and FIG. 21.

FIG. 20 shows the injection efficiency γ and the channel current versus the auxiliary electrode (equivalent to auxiliary electrode (12) in the first embodiment) voltage when the auxiliary electrode formed with a high resistance has transistor threshold values (Vth) of Va or Vb. As shown in this figure, the injection efficiency γ possesses a monotonic decrease characteristic versus the auxiliary electrode voltage.

Variations (irregularities/non-uniformities) in the threshold values of auxiliary electrode transistor are generally caused by variations in the structure of the auxiliary electrode and variations in the concentrations within the substrate. When the programming operation of the first embodiment is used, the auxiliary electrode voltage is applied as a pulse equivalent to the simultaneous programming cell so that variations occur in the injection efficiency γ in each cell due to variations in the auxiliary electrode transistor threshold values. For example when the auxiliary electrode voltage was applied as a pulse V3, the programming speed for the memory cell possessing an auxiliary electrode transistor threshold value Vb, is fast because of the high injection efficiency. However, the programming speed for the memory cell possessing an auxiliary electrode transistor threshold value Va, is slow because the injection efficiency is low. Here, the channel current is assumed to not be dependent on the memory node voltage potential or on the drain voltage.

Unlike the programming method of the first embodiment, in the present embodiment, the auxiliary electrode voltage rises in stages versus the time. As shown in FIG. 21 for example, a method has also been described for linearly raising the auxiliary electrode voltage versus the time. In the following description is related while referring to FIG. 21, but the method for raising the auxiliary electrode voltage need not be a linear method. The voltage may for example be raised exponentially, logarithmically or in stages. The speed of the voltage rise should be set to an optimum value so that the programming speed is as fast as possible.

When the auxiliary electrode voltage is made to rise linearly as shown in FIG. 21, the auxiliary voltage reaches V1 at time ta, and the channel current starts to substantially flow at the auxiliary electrode transistor threshold value Va, so that an electrical charge is injected into the memory node. Afterwards, the discharge of the electrical charge Qi accumulated in the inversion layer, ends at time tb and the programming (write) ends. When the injection efficiency between time ta and tb has reached a largely fixed value that can be shown as approximately γa, the electrical charge quantity (including the auxiliary electrode transistor threshold value Va) injected into the memory node of the memory cell, is Qg=Qi×γa. Next at time tc, the voltage on the auxiliary electrode reaches V3, and channel current starts to substantially flow at the threshold value Vb of the auxiliary electrode transistor, and the electrical charge is injected into the memory node. Afterwards at time td, the electrical charge Qi accumulated in the inversion layer is discharged and the programming ends. The electrical charge quantity injected into the memory node of the memory cell including the threshold value Vb of the auxiliary electrode transistor is Qg=Qi×γa for the same reasons as described above. In FIG. 21, though not plainly shown, in the cell with the largest auxiliary electrode transistor threshold, the auxiliary electrode voltage falls to zero at time te after discharge of the electrical quantity Qi accumulated in that inversion layer has ended. The above description shows that the threshold value of the auxiliary electrode transistor varies when the voltage on the auxiliary electrode is made to rise linearly versus the time. In other words, even with variations, the injection efficiency γ will be largely uniform and the electrical charge quantity injected into each memory node will be substantially a fixed value. Therefore variations in programming can be drastically reduced. Moreover, even when the threshold values of auxiliary electrode transistors of each memory cell are different, a high injection efficiency can be constantly maintained so that the programming (write) time can be shortened even further.

The timing for the programming operation of the present embodiment is described next while referring to FIG. 22. At time t0, the data line (91) is first of all set to the program drain voltage of 4 volts, the control electrode (30) (third electrode) is set to the program word voltage 15 volts (voltage potential E), and the gate electrodes (36) (38) are both set to 8 volts. By simultaneously setting the auxiliary electrode (13) (second electrode) to 8 volts (voltage potential C), the inversion layer (61) (second inversion layer) formed beneath the auxiliary electrode reaches 4 volts (voltage potential D). Afterwards, at time t1, the gate electrode (38) deactivates at 0 volts, the connection between the data line (91) and the inversion layer (61) is terminated, and the inversion layer (61) reaches a floating state. At this time, when the inversion layer capacitance is set as Ci, the charge quantity Qi accumulated on the inversion layer (61) reaches Ci×4 coulombs. Afterwards at time t2, when the auxiliary electrode (12) (first electrode) rises linearly to 2 volts (voltage potential A) at time t3. When the voltage on the auxiliary electrode (12) has reached the threshold value of the auxiliary electrode (12) transistor, the charge Qi accumulated on the inversion layer (61), passes through the substrate surfaces respectively below the memory node (50) and the auxiliary electrode (12) and discharges to the data line (90). The data line reaches 0 volts (voltage potential B) at this time. A state of low resistance is reached at this time, except for the substrate surface below the auxiliary electrode (12) so that when there is a voltage differential between the diffusion layers, an electrical field concentrates below the right terminal of the auxiliary electrode (12) and hot electrons are emitted. The emitted hot electrons are attracted towards the control electrode (30) since the voltage potential is high (voltage potential E) on the control electrode (30) (third electrode). The hot electrons jump the tunnel insulator film (40) potential barrier and are injected into the memory node (50). The substrate surface below the auxiliary electrode (12) is at a high-resistance state at this time so the electrical current flowing between the inversion layer (60) and the data line (90) is not very large, and so the hot electrons can be injected with better efficiency than when there is no auxiliary electrode structure. If programming is not desired then, if the data line (90) is set to approximately 2 volts, or the inversion layer (61) is set to 0 volts, then hot electrons are not emitted and therefore there is no electrical charge injection. Also, if the unselect word line (31) is set (clamped) to an adequately low voltage (for example 0 volts), and the channel of the memory cell driving the unselect word line is made non-conducting, then no information is programmed (written). After the charge on the inversion layer (61) is sufficiently discharged, the auxiliary electrode (12) is deactivated to 0 volts at time t3 and the programming ends. Next, at time t4, the data line (91) is set to 0 volts, and the gate electrode is again set to 8 volts. Consequently, the data line (91) is connected to the inversion layer (61) and the inversion layer (61) is set to 0 volts. The control electrode (30) is afterwards deactivated to 0 volts at time t5, and the auxiliary electrode (13) is deactivated (lowered) to 0 volts at time t6. Aside from the above described differences in programming operation, two bits of information are stored in the memory node (50) the same as in the first example.

The programming operation of the present example is capable of lowering the variations in programming by fixing not only the electrical charge quantity Qi, but also the injection efficiency γ. Moreover, programming can be performed at a constant high injection efficiency even when the transistor threshold values of the auxiliary electrodes are different in each memory cell, so that the programming time can be shortened even further. The operating method of the present embodiment can also be applied to the second through the seventh embodiments, and the same effects obtained.

The present embodiment allows a low cost memory to be obtained since the memory structure of the present embodiment can be fabricated with a small pitch between the auxiliary electrode wiring and because there is no diffusion layer wiring formed by impurities in the memory cell array.

Tenth Embodiment

The tenth embodiment of the present invention is described next while referring to FIG. 5, and FIG. 23 through FIG. 26. The present embodiment is characterized in that the program operation changes according to the threshold voltage level.

In the method in the first example for separating the programming according to threshold value levels, the voltage on the control electrode (word line) was changed for example according to the threshold level. Using this method allowed controlling the electrical charge quantity injected into the memory node, even when utilizing the same programming (write) pulse width.

In the method in the present embodiment, the programming (write) operation changes according to the differential in threshold levels, to control the electrical charge quantity injected into the memory node. The method of this embodiment is therefore capable of shortening the overall programming (write) time compared to programming method using one programming (write) operation.

The two programming operations disclosed in the fourth embodiment, are described for the present embodiment that separates the operation according to the threshold level. The two programming operations are different in that one operation accumulates electrical charges for programming in a local bit line (first capacitance) (inversion layer); or accumulates the stray capacitance of the local data line and the local bit line (inversion layer) as a total capacitance (second capacitance). In the former method, the electrical charge that can be injected into the memory node at one time by a write (programming) pulse is small compared to the latter method so that the memory cell programming speed is slow. However this slow speed allows controlling the injection quantity with good accuracy. In the latter method however, the electrical charge that can be injected into the memory node at one time by a write (programming) pulse is large compared to the former method, so that the memory cell programming speed is fast. For example, in FIG. 5, shows the case when a '01' level which is the highest threshold level is needed. In the programming operation of the latter method, the programming speed of the memory cell is fast so the write (programming) time at the '01' level can be shortened compared to the former method. The width distribution at the highest level '01' may also be somewhat broader than the '00,' '10' levels so that there is no need to control the injection of the electrical charge quantity with good accuracy. The latter writing (programming) method is therefore selected for the '01' level. On the other hand, writing the memory cell at a speed as fast as the '01' level is not required for obtaining the '00,' '10' levels. Moreover, the charge injection quantity can be controlled with good accuracy so that selecting the former method allows shortening the writing time at the '00' and '10' levels. Separating the write (or programming) operation according to the threshold level as described above, allows shortening the total programming time more than when using one programming operation. This method for separating the programming operation according to the threshold level is not limited to the above method and may also be used in combination with the other programming (write) operations shown in the previous embodiments.

Figure 23:
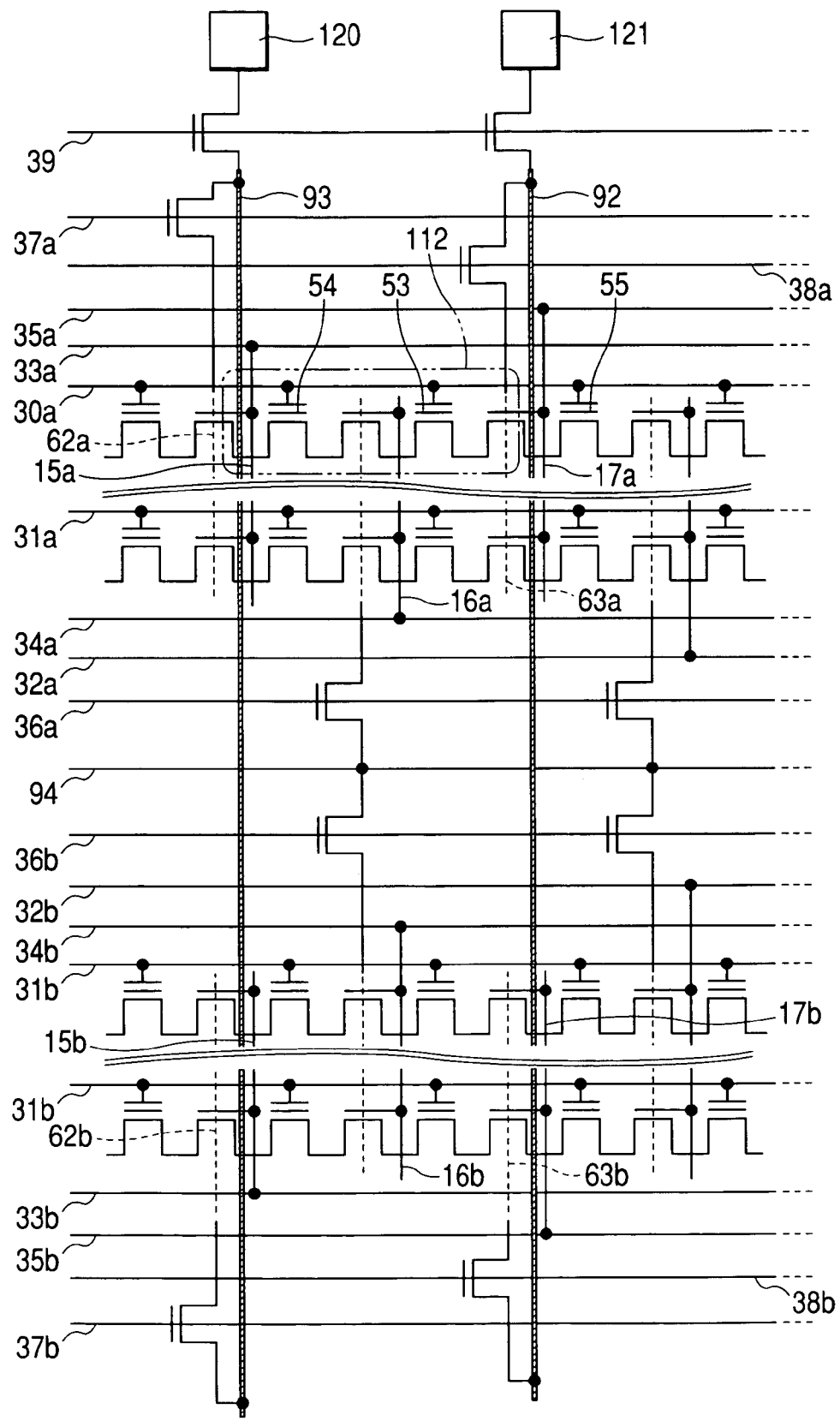
FIG. 23 is a circuit diagram for describing the tenth embodiment of the present invention.
Figure 24:
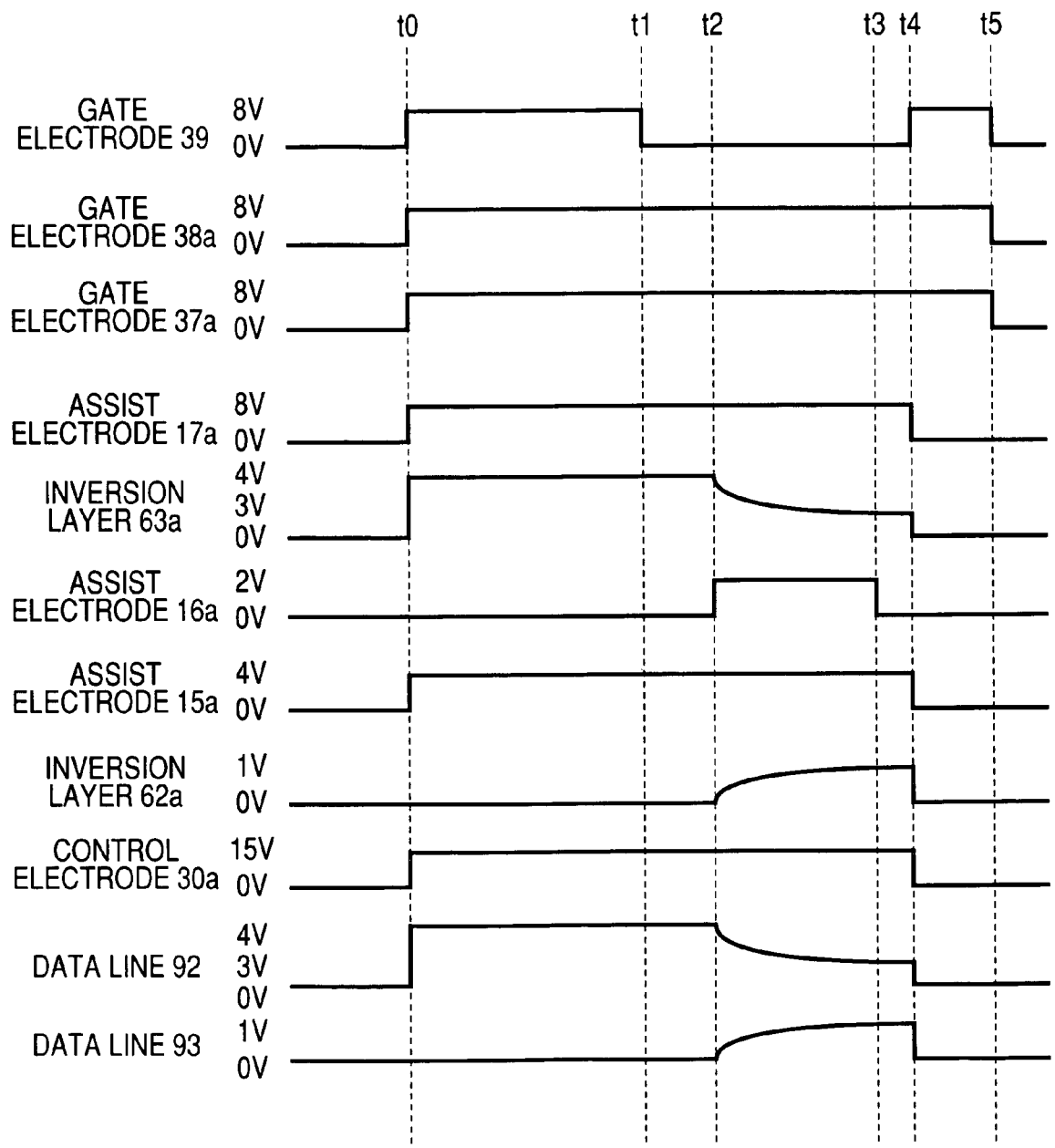
FIG. 24 is a timing chart for describing the programming operation in the tenth embodiment of the present invention.
Figure 25:
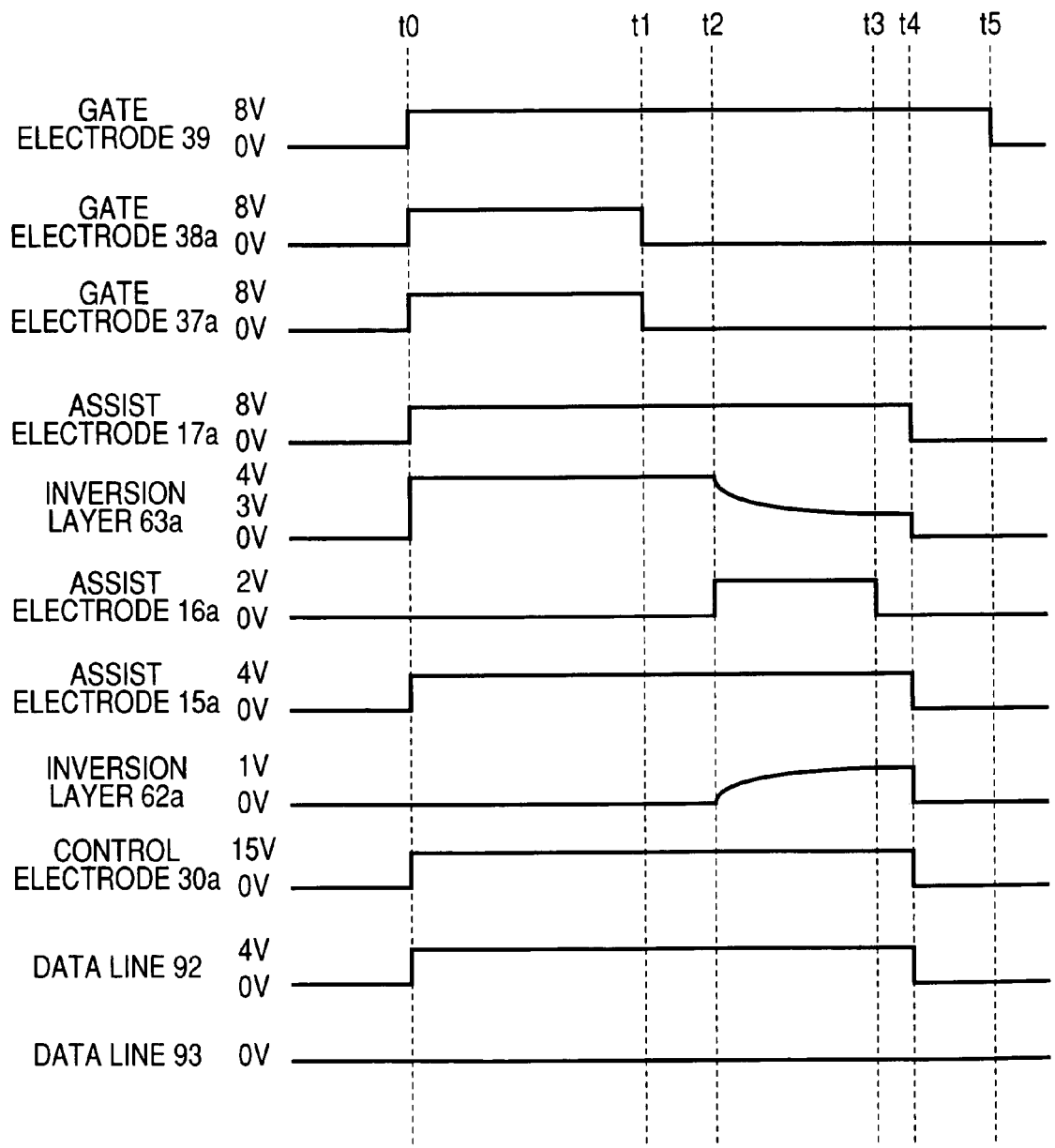
FIG. 25 is a timing chart for describing the programming operation in the tenth embodiment of the present invention.

The present embodiment is next described in detail by utilizing the programming operation timing of FIGS. 24 and 25, and the equivalent circuit diagram such as the memory array of FIG. 23.

The equivalent circuit diagram for the memory array of FIG. 23 is the memory array shown in FIG. 9, with hierarchical connections to the global data lines (92, 93), and numbers rewritten where necessary. Additional items include a joint source line (94), a sense latch circuit, and power supply circuits (120, 121), a global data line and sense latching circuit, and a transistor gate electrode (39) serving as a switch and power supply circuit. The operation for programming the selected cell (112) is described here. Therefore, the electrode and inversion layer voltages in the inactive state are not shown in the following operation timing.

The programming operation at the '01' level is described while referring to FIG. 23 and FIG. 24. First of all, at time t0, the gate electrode (39) is raised to 8 volts, the global data line (92) is set to 4 volts which is the programming drain voltage from the power supply circuit (121), the global data line (93) is set to zero volts from the power supply circuit (120), the control electrode (30a) (fifth electrode) is set to a programming word voltage of 15 volts (voltage potential F), and the gate electrodes (37a) (38a) are both set to 8 volts. Moreover, by setting the auxiliary electrode (15a) (first electrode) to four volts (voltage potential A) and setting the auxiliary electrode (17a) (fourth electrode) to 8 volts (voltage potential C), the inversion layer (63a) (second inversion layer) formed beneath the auxiliary electrode sets to four volts (voltage potential C), and the inversion layer (62a) reaches 0 volts (voltage potential B). Afterwards, at time t1, the gate electrode (39) is lowered (deactivated) to 0 volts, the connection between the global data lines (92, 93) and the power supply circuits (120, 121) is terminated, and the global data lines (92, 93), as well as the local bit lines (inversion layers) (63a, 62a) are set to a floating state. Consequently, an electrical charge consisting of an electrical charge quantity Qi (Ci+Ca)×4) coulombs is accumulated in a capacitor comprised of a global data line capacitance and a local bit line (inversion layer) capacitance having a total capacitance of Ci+Ca. Afterwards at time t2, when the auxiliary electrode (16a) (second electrode) rises to 2 volts (voltage potential E) which is the program voltage, the charge Qi accumulated on the local bit line (inversion layer) (63a) and the global data line (92), passes through the substrate surfaces respectively below the memory node (53) and the auxiliary electrode (16a), and discharges to the capacitor whose total capacitance is formed from the local bit line (inversion layer) (62a) and the global data line (93). A low resistance state is reached at this time, except for the substrate surface below the auxiliary electrode (16a) so that when there is a voltage differential between the diffusion layers, an electrical field concentrates below the right terminal of the auxiliary electrode (16a) and hot electrons are emitted. The emitted hot electrons are attracted towards the control electrode (30a) since the voltage potential is high on the control electrode (30a). The hot electrons jump the tunnel insulator film (40) potential barrier and are injected into the memory node (53). The substrate surface below the auxiliary electrode (16a) is at a high-resistance state at this time so the electrical current flowing between the inversion layer (63a) and the inversion layer (62a) is not very large, and hot electrons can be injected with higher efficiency than the case where there is no auxiliary electrode structure. If no programming (write) is wanted, then if the global data line (93) is set to approximately two volts, or if the global data line (92) is set to zero volts, then no hot electrons are emitted and therefore there is no electrical charge injection. Also, if the unselect word line (31a) is set (clamped) to an adequately low voltage (for example 0 volts), and the channel of the memory cell driving the unselect word line is made non-conducting, then no information is programmed.

The above described programming (write) pulse is repeated until the selected memory cell reaches the '01' level.

After programming the '01' level is finished, the programming operation for the '00,' '01' levels is performed. The programming operation for the '00,' '01' levels is described next while referring to FIG. 23 and FIG. 25. First of all, at time t0, the gate electrode (39) is raised to 8 volts, the data line (92) is set to 4 volts which is the programming drain voltage from the power supply circuit (121), the control electrode (30a) (fifth electrode) is set to a programming word voltage of 15 volts (voltage potential F), and the gate electrodes (37a) (38a) are both set to 8 volts. Moreover, by setting the auxiliary electrode (15a) (first electrode) to four volts (voltage potential A) and setting the auxiliary electrode (17a) (fourth electrode) to 8 volts (voltage potential C), the inversion layer (63a) (second inversion layer) formed beneath the auxiliary electrode sets to four volts (voltage potential C), and the inversion layer (62a) reaches 0 volts (voltage potential B). Afterwards, at time t1, the gate electrodes (37a, 38a) are lowered (deactivated) to 0 volts, the connection between the local bit lines (inversion layer) (62a, 63a) and the global data lines (92, 93) is terminated, and the local bit lines (inversion layer ) (63a, 62a) are set to a floating state. Consequently, an electrical charge consisting of an electrical charge quantity Qi (Ci×4) coulombs is accumulated in a capacitor comprised of the inversion layer capacitance quantity Ci. Afterwards at time t2, when the auxiliary electrode (16a) (second electrode) rises to 2 volts (voltage potential E) which is the program voltage, the charge Qi accumulated on the local bit line (inversion layer) (63a), passes through the substrate surfaces respectively below the memory node (53) and the auxiliary electrode (16a), and discharges to the capacitor whose capacitance Ci is formed from the inversion layer (62a). A low resistance state is reached at this time, except for the substrate surface below the auxiliary electrode (16a) so that when there is a voltage differential between the diffusion layers, an electrical field concentrates below the right terminal of the auxiliary electrode (16a) and hot electrons are emitted. The emitted hot electrons are attracted towards the control electrode (30a) since the voltage potential is high on the control electrode (30a). The hot electrons jump the tunnel insulator film (40) potential barrier and are injected into the memory node (53). The substrate surface below the auxiliary electrode (16a) is at a high-resistance state at this time so the electrical current flowing between the inversion layer (63a) and the inversion layer (62a) is not very large, and hot electrons can be injected with higher efficiency than the case where there is no auxiliary electrode structure. If no programming (write) is wanted, then if the global data line (93) is set to approximately two volts, or if the global data line (92) is set to zero volts, then no hot electrons are emitted and therefore there is no electrical charge injection. Also, if the unselect word line (31a) is set (clamped) to an adequately low voltage (for example 0 volts), and the channel of the memory cell driving the unselect word line is made nonconducting, then no information is programmed. The above described programming (write) pulse is repeated until the selected memory cell reaches the '00' level.

Figure 26:
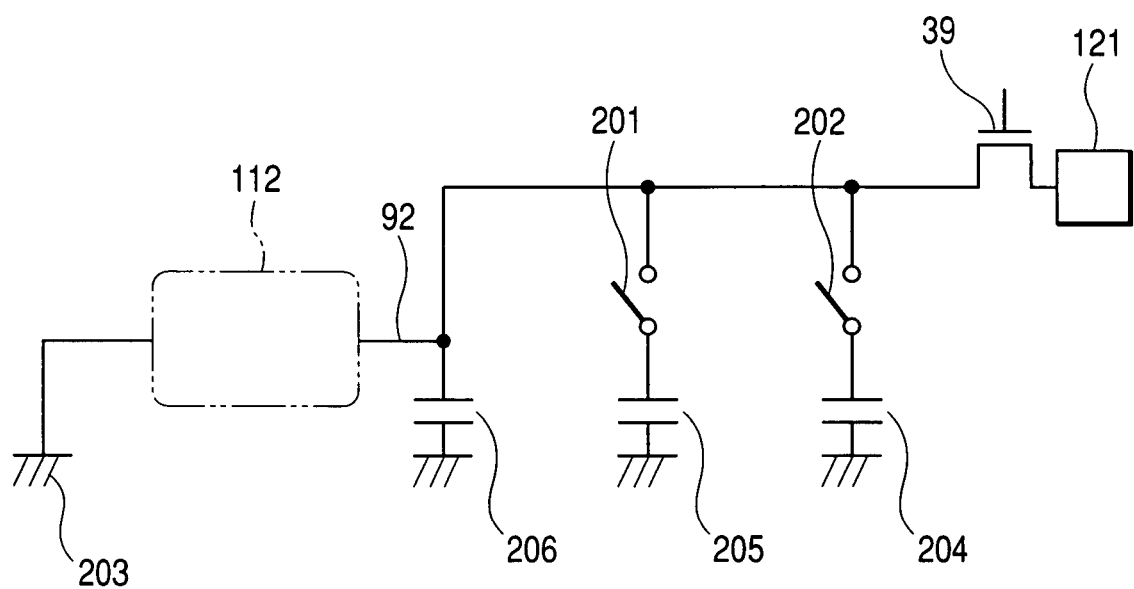
FIG. 26 is a circuit diagram for describing the programming operation in the tenth embodiment of the present invention.

The above described programming (write) operation utilized the capacitance of all the global data lines, and the electrical charge accumulated in the local bit line (inversion layer) capacitance to write (or program) at the '01' level. Other than that case, as shown in FIG. 26, the capacitance of the global data line may be subdivided and used to perform programming using an optional number of (capacitive) charges according to the threshold level. FIG. 26 is a concept diagram as an excerpt from the equivalent circuit for a memory array in FIG. 23, and showing a section of the current path flow in the program select cell (112) from the power supply circuit (121). As shown in FIG. 26, the capacitance of the global data line (92) can be subdivided into multiple capacitances (204, 205, 206) by using the switch (201, 202). For example in order to obtain a '01' level, the switch (201 and 202) can both be turned off, and the charge quantity accumulated in the capacitance 206 utilized. To obtain a '00' level in the same way, the switch 201 can be turned on and the switch 202 turned off, and the total capacitance of the capacitances 206 and 205 utilized for programming. If the level wanted is '01', then the switches 201 and 202 can both be turned on, and the capacitances 206, 205 and 204 utilized for programming. In other words, if the (201, 202) connection conditions are set for accumulating an optimal charge quantity by utilizing the threshold level, then an optimal memory cell programming speed can be obtained and the time required for programming can be lowered.

Needless to say, besides changing the voltage on the control electrode according to the threshold level to perform programming as was described in the first example, programming can also be performed by changing the drain voltage as shown in Table 2.

In the programming method of the present embodiment, the programming operation was changed by means of the threshold value level to control the charge quantity injected into the memory node, and the programming time can be shortened more than when using the normal method of one programming operation.

The present embodiment described selectively using the charges accumulated in the small capacitance local bit line, and the charges accumulated in the relatively large capacitance local bit line and global data lines as the programming (write) method. The description in the present embodiment utilized the inversion layer as the local bit line. However the local bit line need not always be the inversion layer and the same effect can be achieved by using the diffusion layer.

The present embodiment, described storing two bits of information at 4 threshold levels. However, the method of the present embodiment is not limited to two bits, and may be applied to a semiconductor device for storing two or more bits of information.

The present embodiment also described a memory cell with a memory node made from a polysilicon as a so-called floating gate memory cell. However, the present embodiment is not limited to a floating gate memory cell and may be applied for example to semiconductor devices with memory nodes made from insulator film such as silicon nitride.

The present embodiment allows a low cost memory to be obtained since the memory structure of the present embodiment can be fabricated with a small pitch between the auxiliary electrode wiring and because there is no diffusion layer wiring formed by impurities in the memory cell array.

Eleventh Embodiment

The eleventh embodiment of the present invention is described next while referring to FIG. 27 through FIG. 29. In the present embodiment, the array structure is different from that in the first example.

The array structure (FIGS. 2, 3) of the first example (example 1) contained two transistor gate electrodes (37, 38) (above) and one transistor gate electrode (36) (below) connecting between the data line and the inversion layer. In the present embodiment containing one electrode both above and below, the surface area taken up by the transistors can therefore be reduced.

Figure 27:
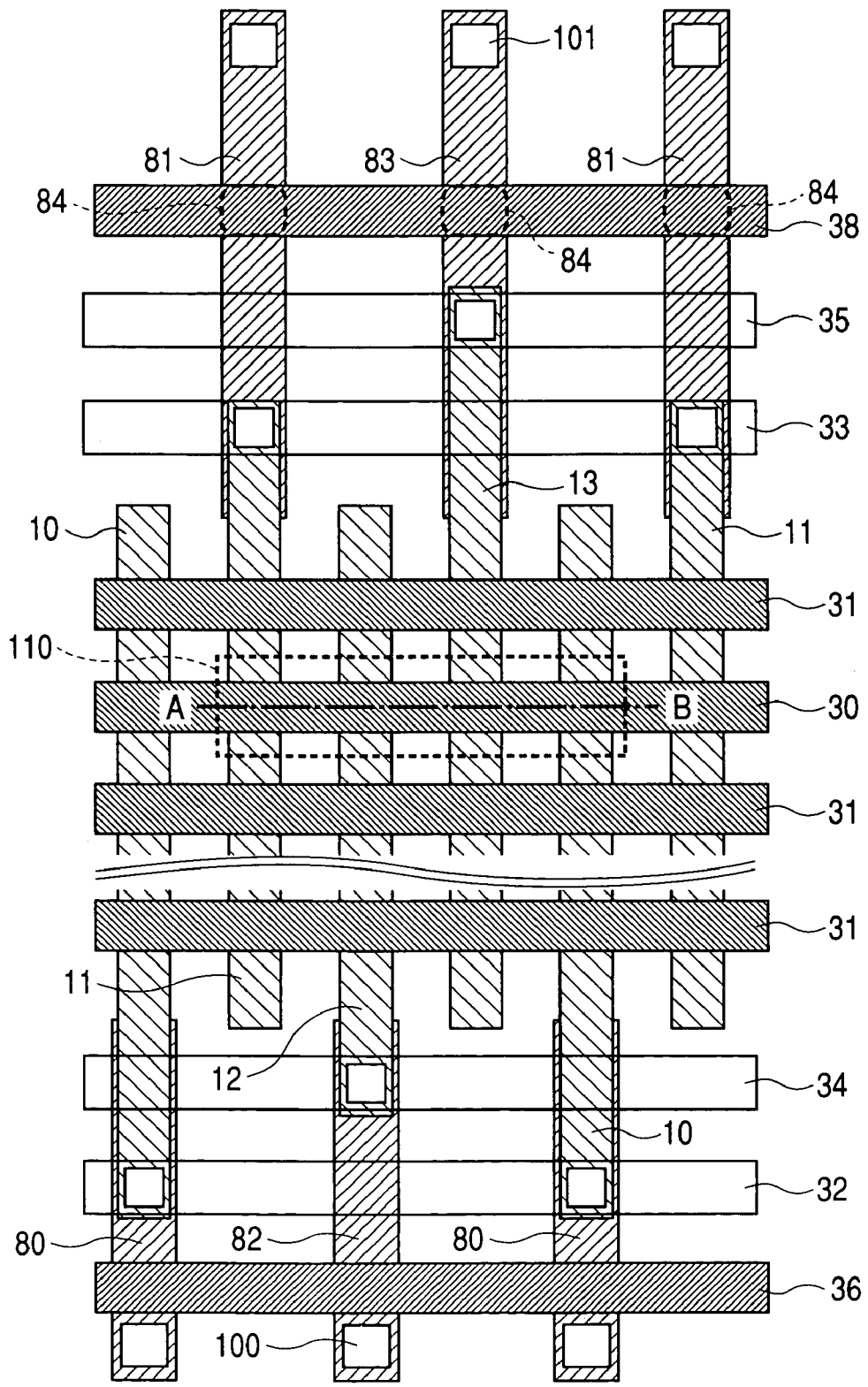
FIG. 27 is top view drawing for describing the eleventh embodiment of the present invention.
Figure 28:
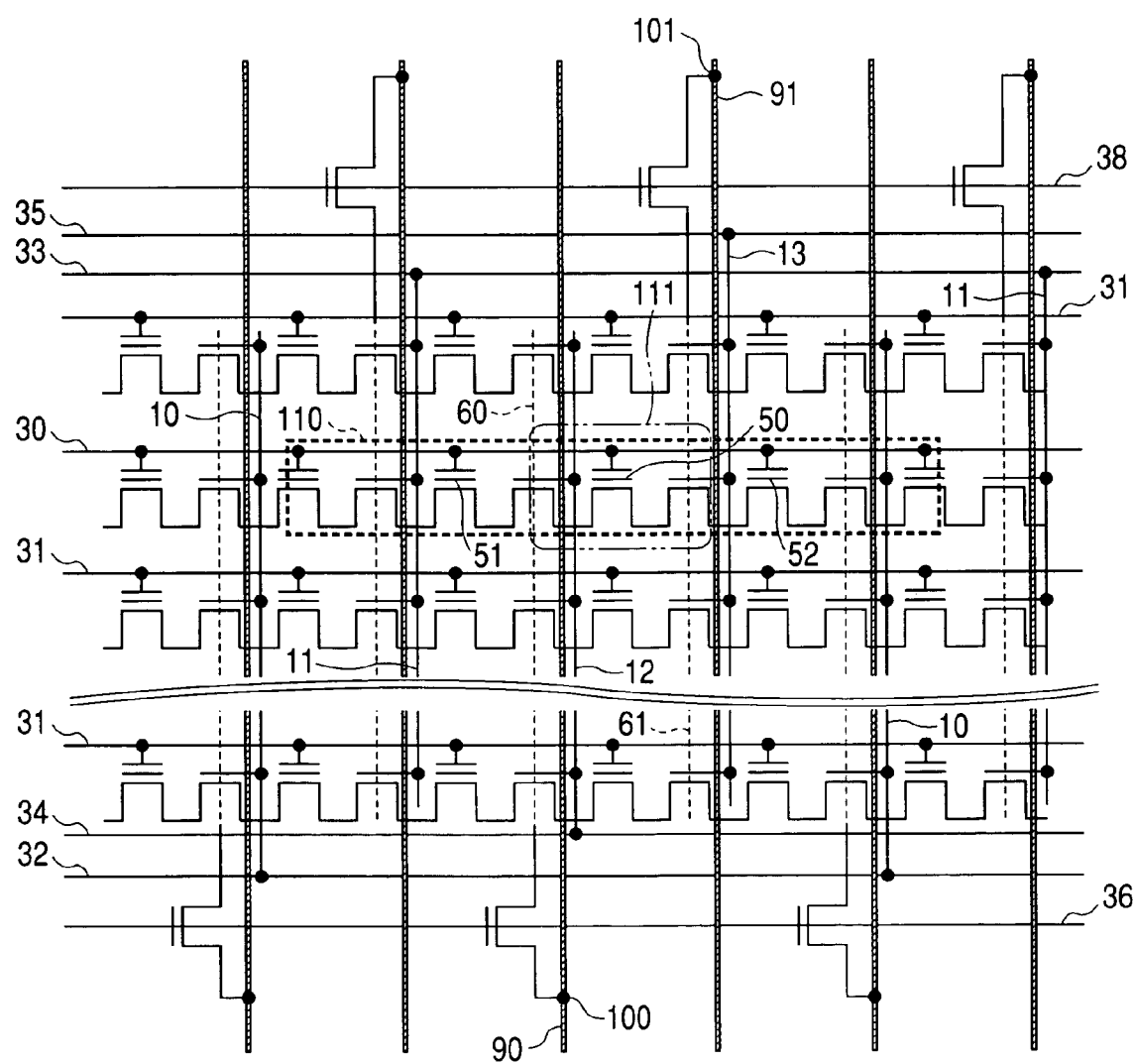
FIG. 28 is a circuit diagram for describing the eleventh embodiment of the present invention.
Figure 29:
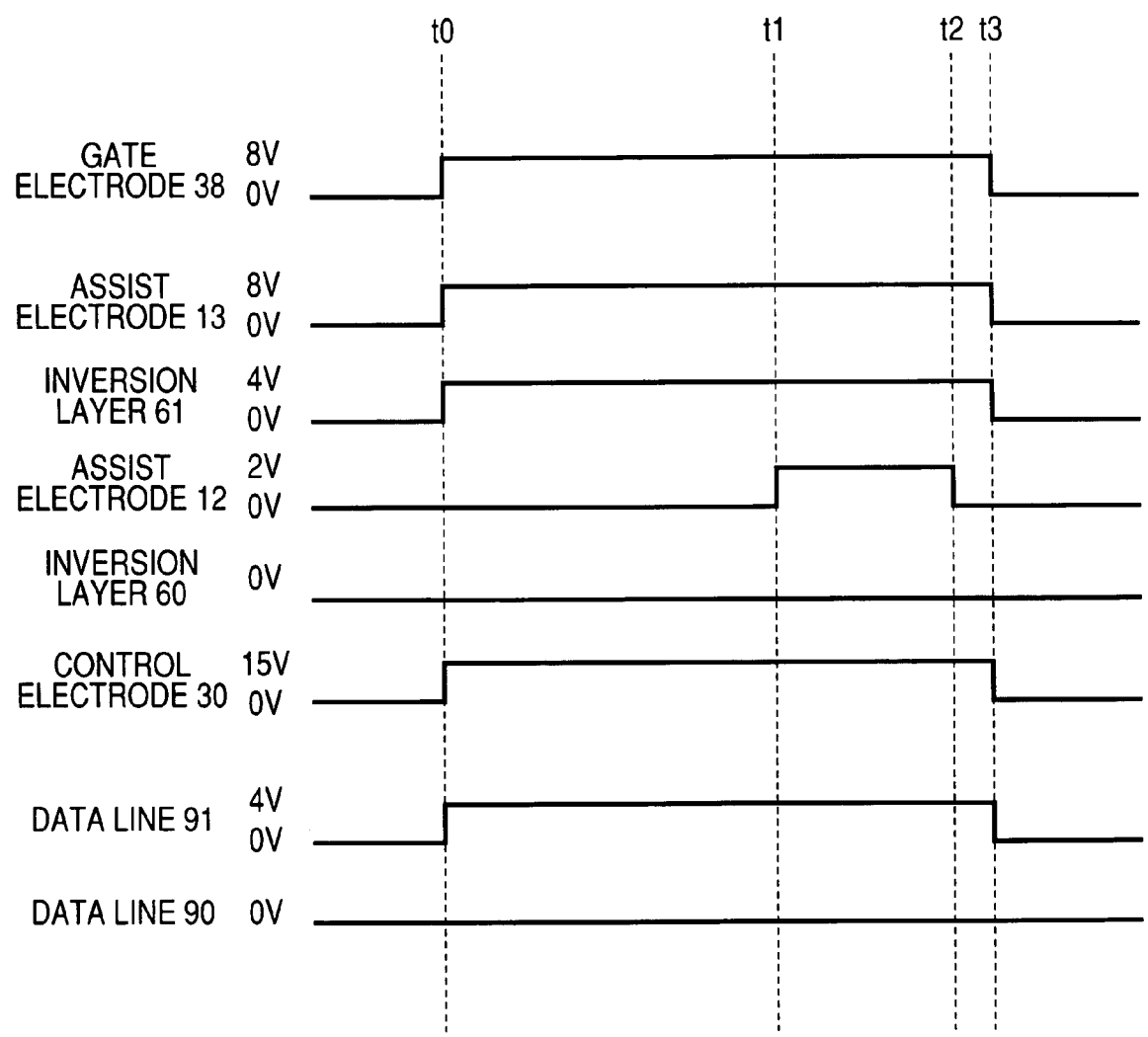
FIG. 29 is a timing chart for describing the programming operation in the eleventh embodiment of the present invention.

FIG. 27 and FIG. 28 are a top view of the array structure of the present invention, and an equivalent circuit diagram. Unlike the structure of the first example, in the present structure there is only one gate electrode (36) at the bottom, and one gate electrode (38) at the top. The surface area that was taken up by the gate electrode (37) inside the array structure can therefore be eliminated.

The timing for the programming operation utilized in the present array structure is described next while referring to FIG. 29. At time t0, first of all, a positive voltage (for example 8 volts) is applied to the auxiliary electrode (13) (second electrode), and a low resistance inversion layer (61) (second inversion layer) is formed on the semiconductor surface below that auxiliary electrode (13). The gate electrode (38) and the gate electrode (36) are respectively raised to eight volts, the control electrode (30) is raised to 15 volts (voltage potential E), and the data line (91) raised to four volts (voltage potential D). At this time the data line (90) is fixed at zero volts (voltage potential B). The auxiliary electrodes (10) (11) on the outer adjacent sides of the memory cell (111) are set to a low voltage (for example 0 volts) level so as not to form an inversion layer, and the devices electrically isolated. During the forming of the second inversion layer (61), the N-type diffusion layer region (83) and the inversion layer (61) conduct, the contact structure (101) formed in the diffusion region conducts, and a voltage can be applied from the global data line (91). The second inversion layer (61) is therefore set to 4 volts (voltage potential D). Next at time t1, when the auxiliary electrode (12) (first electrode) is raised to a voltage (for example 2 volts) (voltage potential A) sufficient to allow forming a high-resistance inversion layer (60) (first inversion layer), a programming current flows via the inversion layer (60), the diffusion layer region (82) and the data line (90), and channel formed below the data line (91), the diffusion layer region (83), the inversion layer (61) and the memory node (50). A concentrated electrical field occurs at this time at the boundary of the inversion layer below the control electrode (30) (third electrode) and the inversion layer (60) (first inversion layer) below one terminal of the auxiliary electrode (12), and hot electrons are emitted. The emitted hot electrons are attracted towards the control electrode (30) since the voltage potential is high on the control electrode (30). The hot electrons jump the tunnel insulator film (40) potential barrier and are injected into the memory node (50). Aside from the above described differences in programming operation, two bits of information are stored in the memory node (50) the same as in the first example.

Using the array structure of the present embodiment allows decreasing the surface area of the memory array due to a fewer number of gate electrodes occupying the interior of the memory array than in the first example. The array structure of the present embodiment can also be applied to the first through seventh embodiments, and the ninth through tenth embodiments, and the same effects can be obtained.

The present embodiment allows a low cost memory to be obtained since the memory structure of the present embodiment can be fabricated with a small pitch between the auxiliary electrode wiring and because there is no diffusion layer wiring formed by impurities in the memory cell array.

The present invention rendered by the inventor was described based on specific embodiments. However the present invention is not limited by these embodiments and of course other variations or adaptations not departing from the spirit or the scope of the present invention are included.

The present invention for example, may also be applied to one-chip microcomputers (semiconductor devices) containing memory cell array sections made up of semiconductor nonvolatile memory devices.

The flash memory of the present invention may be applied to mobile information storage devices such as digital still cameras, and PDA, etc.

TABLE 1

| | PROGRAM WORD VOLTAGE | RANGE OF THRESHOLD VOLTAGE Vth |
|---|---|---|
| "01" | Vww3 | Vth > V3 |
| "00" | Vww2 | V2L < Vth < V2H |
| "10" | Vww1 | V1L < Vth < V1H |
| "11" | Vww0 | V0L < Vth < V0H |

TABLE 2

| | PROGRAMMING DRAIN BIAS | RANGE OF THRESHOLD VOLTAGE Vth |
|---|---|---|
| "01" | Vwd3 | Vth > V3 |
| "00" | Vwd2 | V2L < Vth < V2H |
| "10" | Vwd1 | V1L < Vth < V1H |
| "11" | Vwd0 | V0L < Vth < V0H |

What is claimed is:

1. A semiconductor nonvolatile memory device comprising:
   a first, second and fourth electrode mutually wired in parallel in a first direction formed on a semiconductor surface via an insulating film;
   a fifth electrode for controlling the voltage potential on the semiconductor surface between the first electrode and the second electrode, as well as between the second electrode and the fourth electrode, and the fifth electrode being wired in the second direction substantially perpendicular to the first direction;
   a first charge holding region for holding an electrical charge enclosed by the insulation film on the periphery between the first electrode and the second electrode; and
   a second charge holding region for holding an electrical charge enclosed by the insulation film on the periphery between the second electrode and the fourth electrode,
   wherein, in a write operation, the first electrode is supplied with a voltage potential A so as to form a first inversion layer in a vicinity of the semiconductor surface and the first inversion layer is supplied with a voltage potential B lower than the voltage potential A,
   wherein, in the write operation, the fourth electrode is supplied with a voltage potential C so as to form a second inversion layer in a state with a voltage potential D which is lower than the voltage potential C and higher than the voltage potential B due to coupling between the fourth electrode and the semiconductor surface in a floating state in the vicinity of the fourth electrode,
   wherein, in the write operation, the second electrode is supplied with a voltage potential E lower than the voltage potential A,
   wherein, in the write operation, the fifth electrode is supplied with a voltage potential F higher than voltage potential C, and wherein, in the write operation, the second charge holding region is injected with hot electrons generated at a semiconductor surface between the second and fourth electrodes due to discharge of electrons accumulated on the second inversion layer to the first inversion layer through a semiconductor surface under the second charge holding region, the second electrode, and the first charge holding region.

2. The semiconductor nonvolatile memory device according to claim 1, wherein after the first inversion layer voltage potential is set to the voltage potential B and before the precharge of the first inversion layer, the first inversion layer is set to a floating state by terminating the connection between the first inversion layer and the power supply.

3. The semiconductor nonvolatile memory device according to claim 1, wherein the first and second charge holding means are made up of at least one of polysilicon, silicon particles, and an insulator element containing an electrical charge trap.

4. The semiconductor nonvolatile memory device according to claim 1, wherein one memory cell of the memory device memorizes at least one or more bits of information.

* * * * *